United States Patent
Tominaga et al.

(10) Patent No.: US 9,722,017 B2
(45) Date of Patent: Aug. 1, 2017

(54) SILICON CARBIDE SEMICONDUCTOR DEVICE

(71) Applicant: MITSUBISHI ELECTRIC CORPORATION, Chiyoda-ku (JP)

(72) Inventors: Takaaki Tominaga, Tokyo (JP); Naoyuki Kawabata, Tokyo (JP); Nobuyuki Tomita, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/111,642

(22) PCT Filed: Jan. 16, 2015

(86) PCT No.: PCT/JP2015/051015
§ 371 (c)(1),
(2) Date: Jul. 14, 2016

(87) PCT Pub. No.: WO2015/115202
PCT Pub. Date: Aug. 6, 2015

(65) Prior Publication Data
US 2016/0336392 A1    Nov. 17, 2016

(30) Foreign Application Priority Data

Jan. 28, 2014 (JP) ................................. 2014-012880
Aug. 4, 2014 (JP) ................................. 2014-158615

(51) Int. Cl.
*H01L 29/06* (2006.01)
*H01L 29/161* (2006.01)
(Continued)

(52) U.S. Cl.
CPC .......... *H01L 29/063* (2013.01); *H01L 29/045* (2013.01); *H01L 29/0619* (2013.01);
(Continued)

(58) Field of Classification Search
None
See application file for complete search history.

(56) References Cited

U.S. PATENT DOCUMENTS 5,323,040 A * 6/1994 Baliga ................. H01L 29/1608
257/331
5,396,085 A * 3/1995 Baliga ................. H01L 27/085
257/260
(Continued)

FOREIGN PATENT DOCUMENTS

JP          2003-17696 A     1/2003
JP          2008-507139 A    3/2008
(Continued)

OTHER PUBLICATIONS

International Search Report issued Feb. 17, 2015, in PCT/JP2015/051015 filed Jan. 16, 2015.
(Continued)

Primary Examiner — Evan Pert
(74) Attorney, Agent, or Firm — Oblon, McClelland, Maier & Neustadt, L.L.P.

(57) ABSTRACT

A silicon carbide semiconductor device capable of achieving a decrease in ON resistance and an increase in breakdown voltage and a method for manufacturing a silicon carbide semiconductor device. A silicon carbide semiconductor device includes a silicon carbide substrate and a drift layer. The drift layer includes a breakdown voltage holding layer extending from a point where a doping concentration has a predetermined value to a surface of the drift layer. The doping concentration in the breakdown voltage holding layer continuously decreases from the point where the doping concentration has the predetermined value to a modulation point located further toward the surface of the drift layer than a midpoint in a film thickness direction of the breakdown voltage holding layer. The doping concentration (Continued)

in the breakdown voltage holding layer continuously increases from the modulation point to the surface of the drift layer.

15 Claims, 14 Drawing Sheets

(51) Int. Cl.
H01L 29/872 (2006.01)
H01L 29/47 (2006.01)
H01L 29/36 (2006.01)
H01L 29/861 (2006.01)
H01L 29/16 (2006.01)
H01L 29/32 (2006.01)
H01L 29/66 (2006.01)
H01L 29/04 (2006.01)
H01L 29/10 (2006.01)
H01L 29/167 (2006.01)
H01L 29/78 (2006.01)

(52) U.S. Cl.
CPC ........ H01L 29/1095 (2013.01); H01L 29/167 (2013.01); H01L 29/1608 (2013.01); H01L 29/32 (2013.01); H01L 29/36 (2013.01); H01L 29/47 (2013.01); H01L 29/6606 (2013.01); H01L 29/66068 (2013.01); H01L 29/7802 (2013.01); H01L 29/8611 (2013.01); H01L 29/872 (2013.01)

(56) References Cited

U.S. PATENT DOCUMENTS

| | | | |
|---|---|---|---|
| 5,399,883 A * | 3/1995 | Baliga | H01L 29/0891 257/493 |
| 6,191,447 B1 * | 2/2001 | Baliga | H01L 29/42368 257/330 |
| 6,313,482 B1 * | 11/2001 | Baliga | H01L 29/0619 257/168 |
| 6,787,848 B2 | 9/2004 | Ono et al. | |
| 7,045,426 B2 | 5/2006 | Ono et al. | |
| 7,199,442 B2 | 4/2007 | Shenoy | |
| 7,468,314 B2 | 12/2008 | Shenoy et al. | |
| 7,994,548 B2 * | 8/2011 | Sheridan | H01L 29/1058 257/263 |
| 8,772,140 B2 | 7/2014 | Elpelt et al. | |
| 2006/0192256 A1 * | 8/2006 | Cooper | H01L 29/0696 257/401 |
| 2008/0142811 A1 * | 6/2008 | Matocha | H01L 29/0878 257/77 |
| 2009/0020766 A1 * | 1/2009 | Ohtsuka | H01L 29/45 257/77 |
| 2009/0278137 A1 * | 11/2009 | Sheridan | H01L 29/1058 257/77 |
| 2009/0278177 A1 * | 11/2009 | Sankin | H01L 29/1058 257/272 |
| 2012/0241766 A1 * | 9/2012 | Ohtsuka | C30B 23/02 257/77 |
| 2013/0256698 A1 * | 10/2013 | Sdrulla | H01L 21/049 257/77 |
| 2014/0027781 A1 * | 1/2014 | Ryu | H01L 29/7811 257/77 |
| 2014/0145209 A1 * | 5/2014 | Kumagai | H01L 29/41766 257/77 |
| 2014/0145289 A1 * | 5/2014 | Zhang | H01L 29/47 257/475 |
| 2015/0028351 A1 * | 1/2015 | Van Brunt | H01L 29/1608 257/77 |
| 2015/0084063 A1 * | 3/2015 | Van Brunt | H01L 29/66143 257/77 |
| 2015/0097226 A1 * | 4/2015 | Lichtenwalner | H01L 29/4925 257/329 |
| 2016/0126306 A1 * | 5/2016 | Sdrulla | H01L 29/0626 257/77 |
| 2016/0141371 A1 * | 5/2016 | Tega | H01L 21/0465 257/77 |
| 2016/0197201 A1 * | 7/2016 | Van Brunt | H01L 29/872 257/77 |
| 2017/0040312 A1 * | 2/2017 | Curatola | H01L 27/0629 |
| 2017/0069727 A1 * | 3/2017 | Blanchard | H01L 29/408 |

FOREIGN PATENT DOCUMENTS

| | | |
|---|---|---|
| JP | 2012-533184 A | 12/2012 |
| JP | 2013-18659 A | 1/2013 |
| WO | WO 2006-019898 A2 | 2/2006 |

OTHER PUBLICATIONS

International Preliminary Report on Patentability and Written Opinion issued on Aug. 11, 2016 in PCT/JP2015/051015 with English translation.

* cited by examiner

F I G. 4
102
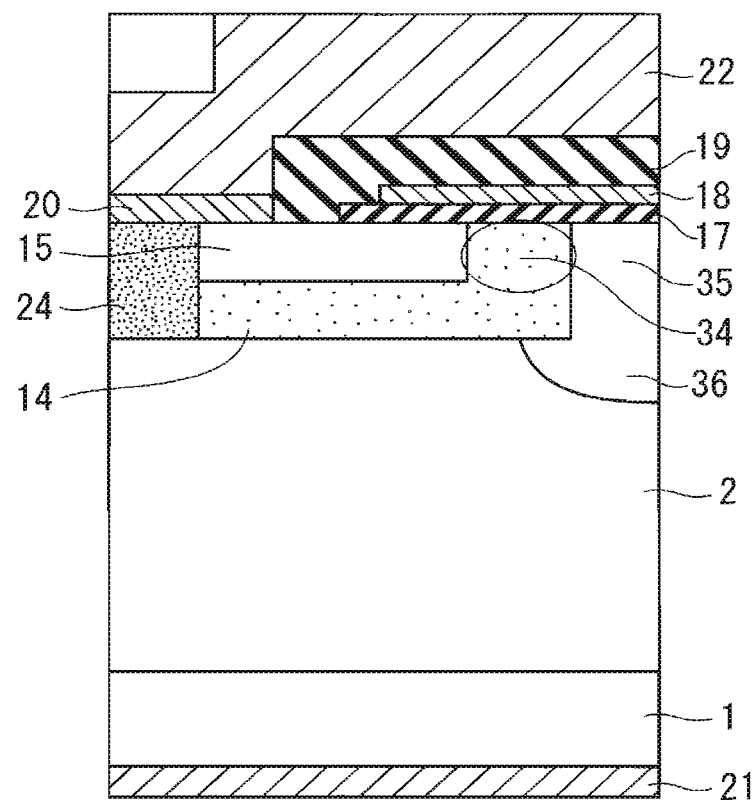

F I G. 1 1
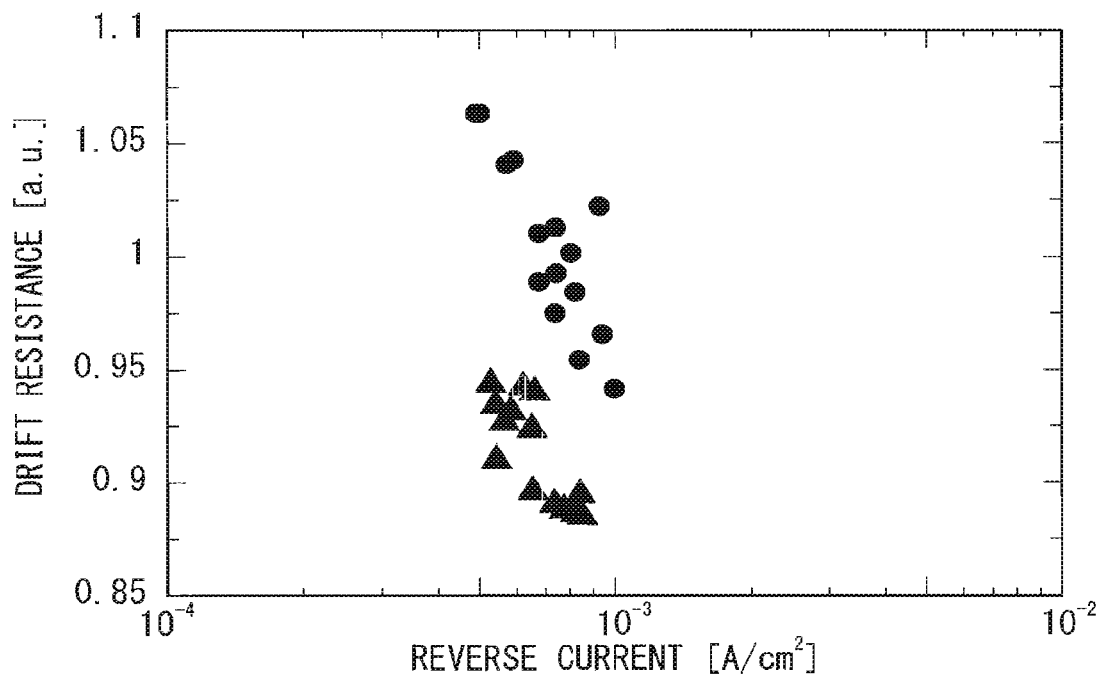
F I G. 1 2
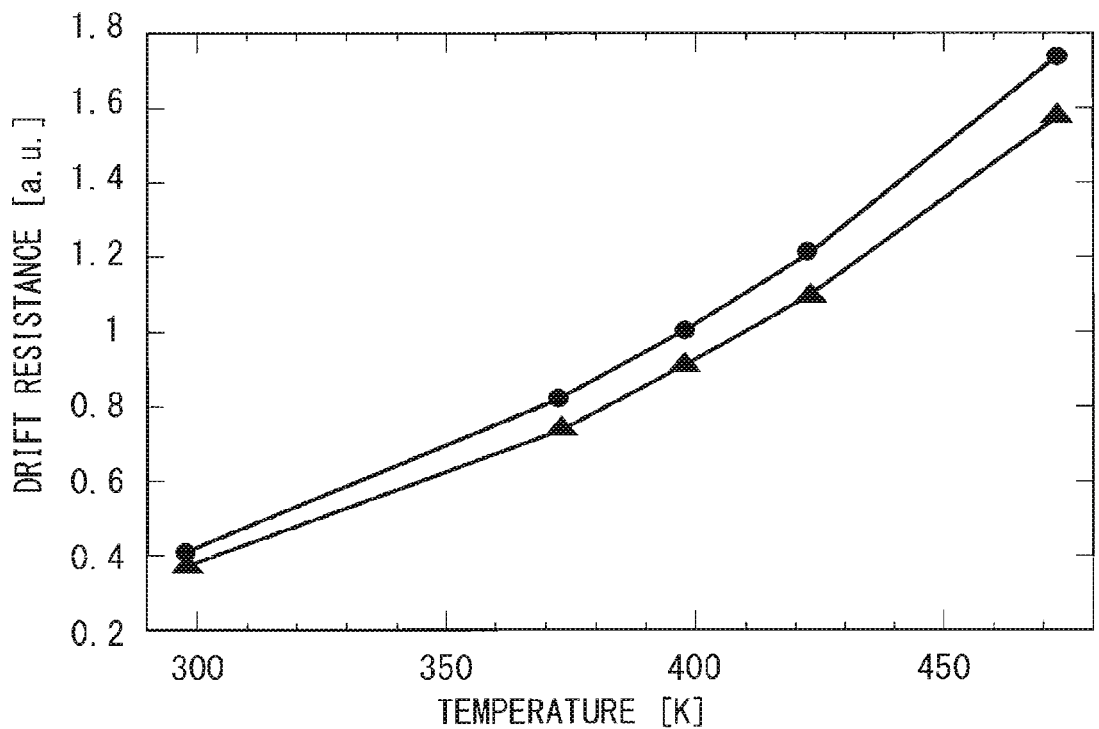

SILICON CARBIDE SEMICONDUCTOR DEVICE

TECHNICAL FIELD

The present technology relates to a silicon carbide semiconductor device and a method for manufacturing a silicon carbide semiconductor device.

BACKGROUND ART

Wide band gap semiconductor materials such as silicon carbide have a higher tolerance to breakdown voltage than that of silicon, allowing for an increase in impurity concentration of a substrate and a decrease in resistance of the substrate in comparison with the silicon material. The decrease in resistance of the substrate can reduce a loss in switching operations of a power element. The wide band gap semiconductor materials in comparison with silicon have a higher thermal conductivity and also have excellent mechanical strength. Thus, the wide band gap semiconductor materials are expected to be materials capable of achieving small, low-loss, high-efficiency power semiconductor devices.

Power semiconductor devices including silicon carbide (silicon carbide power semiconductor devices) typically have a current path in a direction perpendicular to a substrate face for securing a density of current. Further, the power semiconductor devices including silicon carbide (silicon carbide power semiconductor devices) include a drift layer that is located on a silicon carbide substrate and that has a doping concentration lower than that in the substrate for securing breakdown voltage of the device.

The silicon carbide power semiconductor device has high breakdown voltage in recent times, and thus the drift layer has a greater thickness, causing a longer current path in the drift layer. Consequently, drift resistance forms an increasing proportion of ON resistance, which increases a conduction loss of the device.

The greater thickness of the drift layer increases distortion of lattice in the drift layer due to a mismatch in lattice constant between the drift layer and the substrate, and thus a density of crystal defects in the drift layer increases, causing an increase in resistance and a decrease in yields of the device. For this reason, it is an extremely important challenge to achieve the structure of the device capable of reducing a drift resistance and a density of crystal defects.

Although a drift layer typically has a fixed doping concentration in a film thickness direction, Patent Document 1, for example, discloses a doping concentration distribution of a drift layer having an impurity concentration continuously decreased in a growth direction, which can reduce the drift resistance more than the case where the doping concentration is fixed.

Patent Document 2, for example, discloses that a density of crystal defects can be reduced by forming a buffer layer, which gradually reduces an impurity concentration, between a substrate and a drift layer while the drift layer has the fixed doping concentration in the film thickness direction.

PRIOR ART DOCUMENT

Patent Document

Patent Document 1: Japanese Unexamined Patent Application Publication (Translation of PCT Application) No. 2012-533184
Patent Document 2: Japanese Patent Application Laid-Open No. 2013-18659

SUMMARY OF INVENTION

Problems to be Solved by the Invention

For the conventional semiconductor devices as described above, the doping concentration distribution of the impurities in the film thickness direction is expressed in the form of an irrational function in Patent Document 1, for example.

It is, however, extremely difficult to control the doping concentration distribution in the form of a quadratic function or higher by the typical technique (change in flow rate of doping gas) actually used in forming the drift layer. Thus, the doping concentration distribution of the drift layer cannot be brought close to the doping concentration distribution ideal for reducing the ON resistance, and furthermore, for increasing the breakdown voltage by the achievable technique.

The present technology has been made in view of the above mentioned problems, and an object thereof is to provide a silicon carbide semiconductor device capable of achieving a decrease in ON resistance and an increase in breakdown voltage and to provide a method for manufacturing a silicon carbide semiconductor device.

Means to Solve the Problems

A silicon carbide semiconductor device according to one aspect of the present technology includes a silicon carbide substrate of a first conductivity type and a drift layer of the first conductivity type that is formed on the silicon carbide substrate and is doped with a dopant. The drift layer includes a breakdown voltage holding layer having a film thickness of d from a point where a doping concentration of the dopant has a value of greater than or equal to $4 \times 10^{15}$ cm$^{-3}$ and less than or equal to $2 \times 10^{17}$ cm$^{-3}$ to a surface of the drift layer. The doping concentration of the dopant in the breakdown voltage holding layer continuously decreases in a film thickness direction of the breakdown voltage holding layer toward the surface of the drift layer.

A silicon carbide semiconductor device according to another aspect of the present technology includes a silicon carbide substrate of a first conductivity type and a drift layer of the first conductivity type that is formed on the silicon carbide substrate and is doped with a dopant. The drift layer includes a breakdown voltage holding layer having a film thickness of d from a point where a doping concentration of the dopant has a predetermined value to a surface of the drift layer. The doping concentration of the dopant in the breakdown voltage holding layer continuously decreases in a film thickness direction of the breakdown voltage holding layer toward the surface of the drift layer from the point where the doping concentration of the dopant in the breakdown voltage holding layer has the predetermined value to a modulation point located further toward the surface of the drift layer than a midpoint in the film thickness direction of the breakdown voltage holding layer. The doping concentration of the dopant in the breakdown voltage holding layer continuously increases in the film thickness direction of the breakdown voltage holding layer toward the surface of the drift layer from the modulation point to the surface of the drift layer.

A method for manufacturing a silicon carbide semiconductor device according to one aspect of the present technology is a method for manufacturing the silicon carbide semiconductor device according to any descriptions above. The method includes forming the drift layer by epitaxial growth by temporarily decreasing or increasing an amount of supply of a dopant gas while an amount of supply of a silicon atom supply gas and of a carbon atom supply gas is fixed.

A method for manufacturing a silicon carbide semiconductor device according to another aspect of the present technology is a method for manufacturing the silicon carbide semiconductor device according to any descriptions above. The method includes forming the drift layer by epitaxial growth by temporarily increasing or decreasing an amount of supply of at least one of a silicon atom supply gas and a carbon atom supply gas while an amount of supply of a dopant gas is fixed.

Effects of the Invention

According to the above-mentioned aspects of the present invention, the doping concentration distribution of the drift layer can be brought close to the doping concentration distribution ideal for reducing the ON resistance, and furthermore, for increasing the breakdown voltage by the achievable technique.

These and other objects, features, aspects and advantages of the present technology will become more apparent from the following detailed description of the present technology when taken in conjunction with the accompanying drawings.

BRIEF DESCRIPTION OF DRAWINGS

FIG. 4 is a cross-sectional view showing a configuration of a silicon carbide semiconductor element according to an embodiment.

FIG. 11 is a diagram showing a relationship between a reverse current and the drift resistance according to the embodiment.

FIG. 12 is a diagram showing a relationship between a temperature and the drift resistance according to the embodiment.

DESCRIPTION OF EMBODIMENTS

Figure 1:
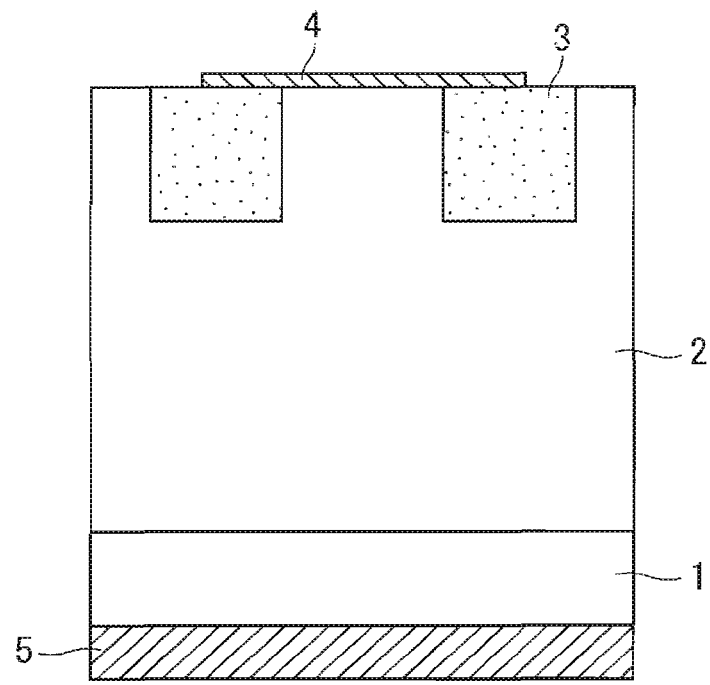
FIG. 1 is a cross-sectional view showing a configuration of a silicon carbide semiconductor device according to an embodiment.

Hereinafter, each embodiment is described with reference to the accompanying drawings. In addition, the diagrams are schematically shown, and an interrelationship between size and a position of an image shown in each of the different diagrams is not necessarily accurate and may be appropriately modified. In the following description, the same components have the same reference numerals. Their names and functions are also the same. Accordingly, their detailed description will be omitted in some cases.

If terms that refer to specific positions and directions such as "up," "down," "side," "bottom," "front," and "back" are used in the following description, the terms are used for the sake of convenience to facilitate the understanding of the embodiment and are not related to actual directions in the embodiment.

As to conductivity types of impurities, an n-type is assumed to be a "first conductivity type," and a p-type is assumed to be a "second conductivity type" in the embodiments below.

First Embodiment (SBD, Inclined Epitaxy)

<Configuration>

Figure 2:
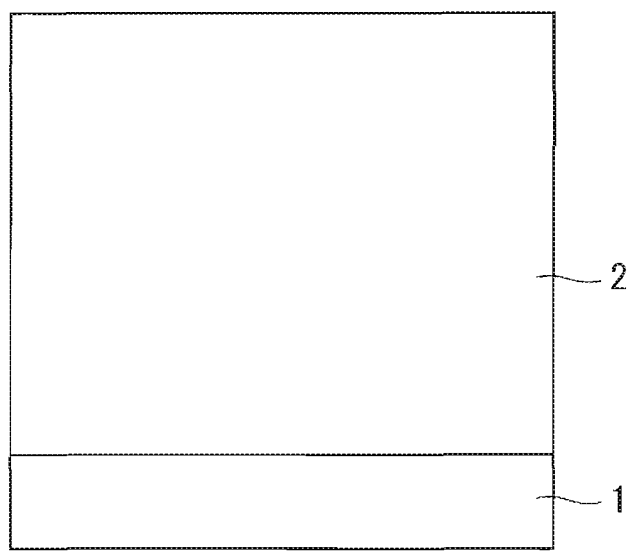
FIG. 2 is a cross-sectional view showing a structure of an epitaxial substrate according to the embodiment.

FIG. 1 is a cross-sectional view showing a configuration of a silicon carbide semiconductor device according to a first embodiment of the present invention. FIG. 2 is a cross-sectional view showing a structure of an epitaxial substrate according to the first embodiment of the present invention.

As shown in FIG. 2, an epitaxial substrate 100 includes a silicon carbide substrate 1 of the n-type being the first conductivity type that has an off-angle from a 4H—SiC (0001) plane and has a low resistance, and the epitaxial substrate 100 includes a drift layer 2 of the n-type formed on the silicon carbide substrate 1 by epitaxial growth.

It is sufficient as long as the silicon carbide substrate 1 is the first conductivity type. The presence or absence of the off-angle does not affect the effects of the present invention.

Then, a silicon carbide Schottky barrier diode 101 (silicon carbide semiconductor device) shown in FIG. 1 is formed with the epitaxial substrate 100.

In the silicon carbide Schottky barrier diode 101, the layer formed by the epitaxial growth in the epitaxial substrate 100 is the drift layer 2 of the n-type for holding breakdown voltage. A p-type region 3 of the second conductivity type is formed as a termination structure in a peripheral portion of an element of the silicon carbide Schottky barrier diode 101. The p-type region 3 is selectively formed in the drift layer 2 of the epitaxial substrate 100 by ion implantation and activation heat treatment. The p-type region 3 is formed so as to have a layer thickness of approximately 0.5 μm to 2 μm and a doping concentration of approximately $10^{17}$ cm$^{-3}$ to $10^{19}$ cm$^{-3}$.

An anode electrode 4 is formed across the drift layer 2 and the p-type region 3. Further, a cathode electrode 5 is formed on a back surface of the silicon carbide substrate 1 having the low resistance.

The anode electrode 4 is in Schottky contact with the drift layer 2, and may be in Schottky contact or ohmic contact with the p-type region 3. The anode electrode 4 has a contact resistance value of less than or equal to $10^{-3}$ Ωcm$^2$ to function as an ohmic electrode for the p-type region 3. In this case, a rise in ON-state voltage due to influences of a contact portion when a current passes through the p-type region 3 can be reduced. The contact resistance value of less than or equal to $10^{-4}$ Ωcm$^2$ is more preferred, so that the rise in ON-state voltage due to the influences of the contact portion will be almost insignificant.

In the silicon carbide substrate 1, V-group elements are doped at a high concentration because a resistivity is preferably minimized in order to prevent an increase in element resistance. On the other hand, an excessively high doping concentration makes crystal defects easy to be introduced, so that doping is normally performed to set the doping concentration around $10^{19}$ cm$^{-3}$. In this embodiment, elements having a lower lattice constant of silicon carbide crystals as doped more at a high concentration, for example, nitrogen, are used as a dopant for the silicon carbide substrate 1.

Hereinafter, a layer extending from a point where the dopant has the doping concentration of a predetermined value to the surface of the drift layer 2 is referred to as a breakdown voltage holding layer.

Figure 5:
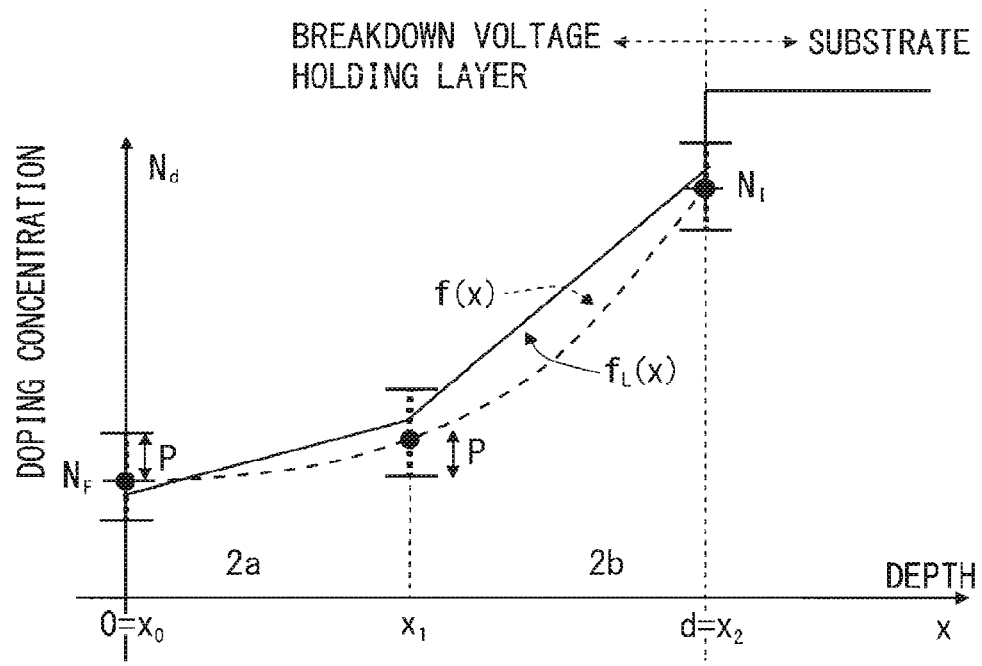
FIG. 5 is a diagram showing a concentration distribution of a breakdown voltage holding layer according to the embodiment.
Figure 6:
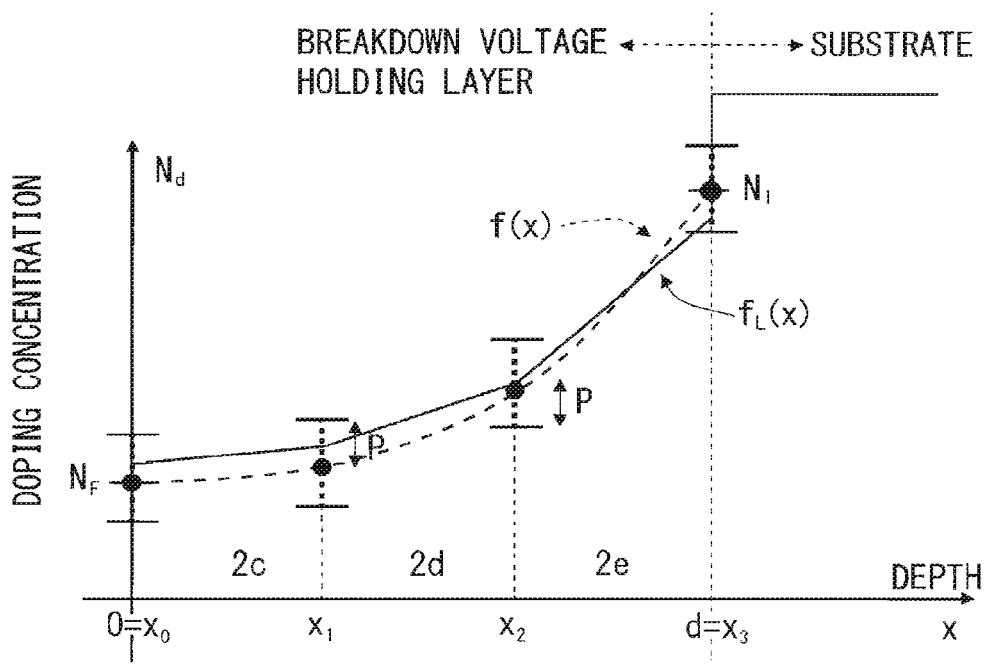
FIG. 6 is a diagram showing the concentration distribution of the breakdown voltage holding layer according to the embodiment.
Figure 7:
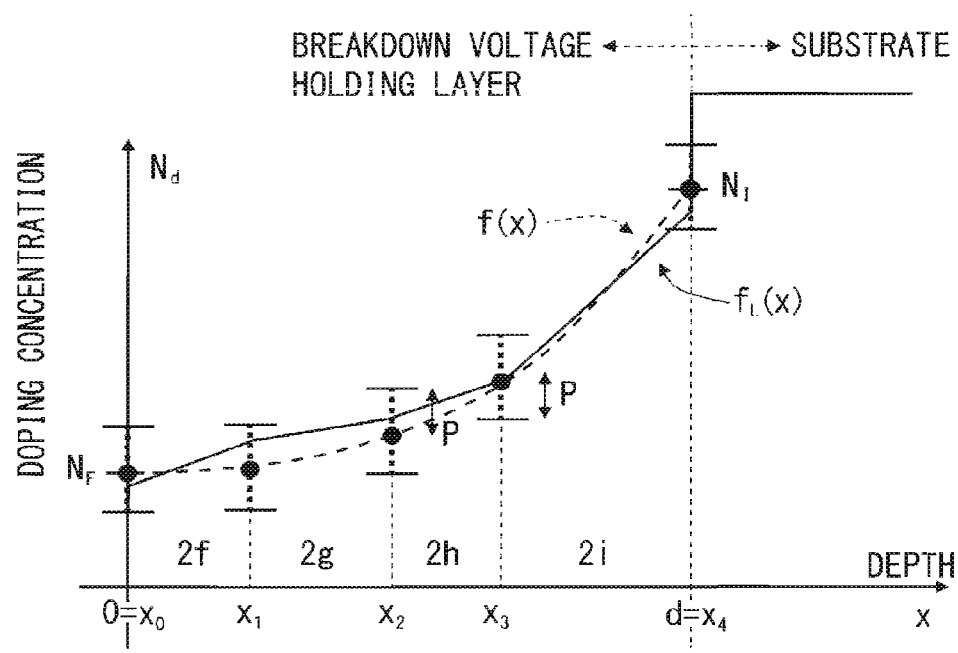
FIG. 7 is a diagram showing the concentration distribution of the breakdown voltage holding layer according to the embodiment.

FIGS. 5 to 7 are diagrams showing a concentration distribution of the breakdown voltage holding layer. In each diagram, the vertical axis and the horizontal axis respectively represent the doping concentration and a depth.

The breakdown voltage holding layer has the doping concentration continuously decreased from an interface with the silicon carbide substrate 1 to the surface of the breakdown voltage holding layer. Further, the breakdown voltage holding layer has a multilayer structure in which two or more linear concentration distribution layers having the doping concentration continuously decreased are laminated.

Herein, the surface of the drift layer 2 is a Schottky interface formed between the anode electrode 4 and the drift layer 2 in this embodiment.

An ideal doping concentration distribution f(x) is expressed by

[Math 1]

$$f(x) = N_F \left\{ 1 - \left[ 1 - \left(\frac{N_F}{N_I}\right)^2 \right] \frac{x}{d} \right\}^{-1/2} \quad (1)$$

$$(0 \leq x \leq d),$$

and a relationship between a doping concentration $f_L(x_i)$ at two end portions (position $x_i$) of each linear concentration distribution layer in a film thickness direction and the ideal doping concentration distribution f(x) is expressed by $$(1-P)f(x_i) \leq f_L(x_i) \leq (1+P)f(x_i) \quad \text{[Math 2]}$$

where a doping concentration $N_F$ ($= f_L(x_0) = \in Ec^2/3qV_B$) represents a doping concentration of impurities in the surface of the drift layer, a doping concentration $N_I$ ($2\times10^{17}$ cm$^{-3} \leq N_I \leq N_S$) represents a doping concentration of impurities in the interface between the substrate and the drift layer, d represents a film thickness of the breakdown voltage holding layer, and P represents a predetermined proportion.

Herein, $E_C$ represents a breakdown electric field uniquely determined by a property value of silicon carbide. $V_B$ represents a design breakdown voltage, and it is sufficient that $V_B$ takes on values 1.2 times to 1.5 times as much as a rated voltage, for example. $\in$ represents a dielectric constant of silicon carbide. q represents an elementary charge.

While it is the most preferable that the doping concentration $N_I$ is equal to the doping concentration $N_S$ in the silicon carbide substrate, the inventor has found from the results of diligent research that the doping concentration $N_I$ of greater than or equal to approximately $2\times10^{17}$ cm$^{-3}$ is sufficient to obtain the effects of reducing a desirable drift resistance and suppressing a decline in the quality of crystals of the drift layer.

Figure 9:
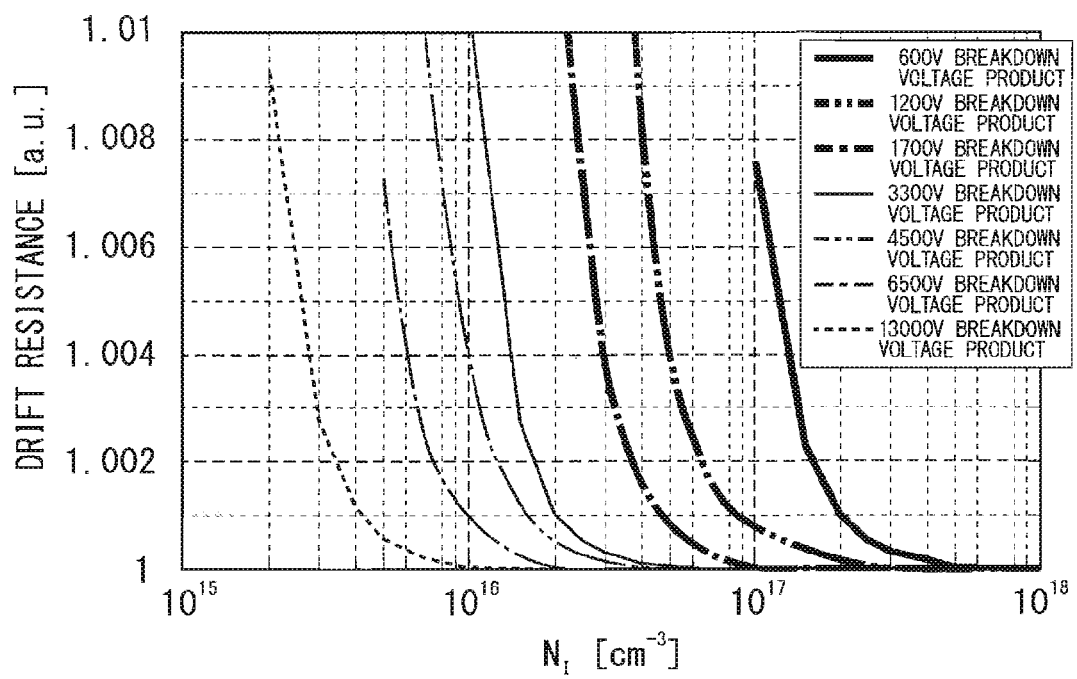
FIG. 9 is a diagram showing a relationship between a doping concentration $N_I$ in the drift layer and a drift resistance.

FIG. 9 shows a relationship between the doping concentration $N_I$ in the ideal doping concentration distribution, which is expressed by the expression (1), and the drift resistance in each breakdown voltage product. In FIG. 9, the vertical axis and the horizontal axis respectively represent the drift resistance [a.u.] and the doping concentration [cm$^{-3}$]. In the expression (1), the doping concentration distribution is calculated by determining the doping concentration $N_I$ at any value, to thereby calculate the drift resistance.

As shown in FIG. 9, when the doping concentration is greater than or equal to approximately $2\times10^{17}$ cm$^{-3}$, it is clear that the effect of reducing the drift resistance is affected by less than or equal to approximately 0.1% in all of the breakdown voltage products, resulting in almost no problem on electrical characteristics.

The predetermined proportion P is a value with consideration given to variations in concentration of impurities in the process by the epitaxial growth. It is sufficient that the predetermined proportion P is 20% (namely, 0.2), and more preferably, 10% (namely, 0.1). A smaller value of the predetermined proportion P causes an actual doping concentration distribution to be brought closer to the doping concentration distribution f(x) ideal for reducing the drift resistance. Thus, the effect of reducing the drift resistance can be expected. The effect of reducing a density of crystal defects in the drift layer also becomes more remarkable.

Figure 13:
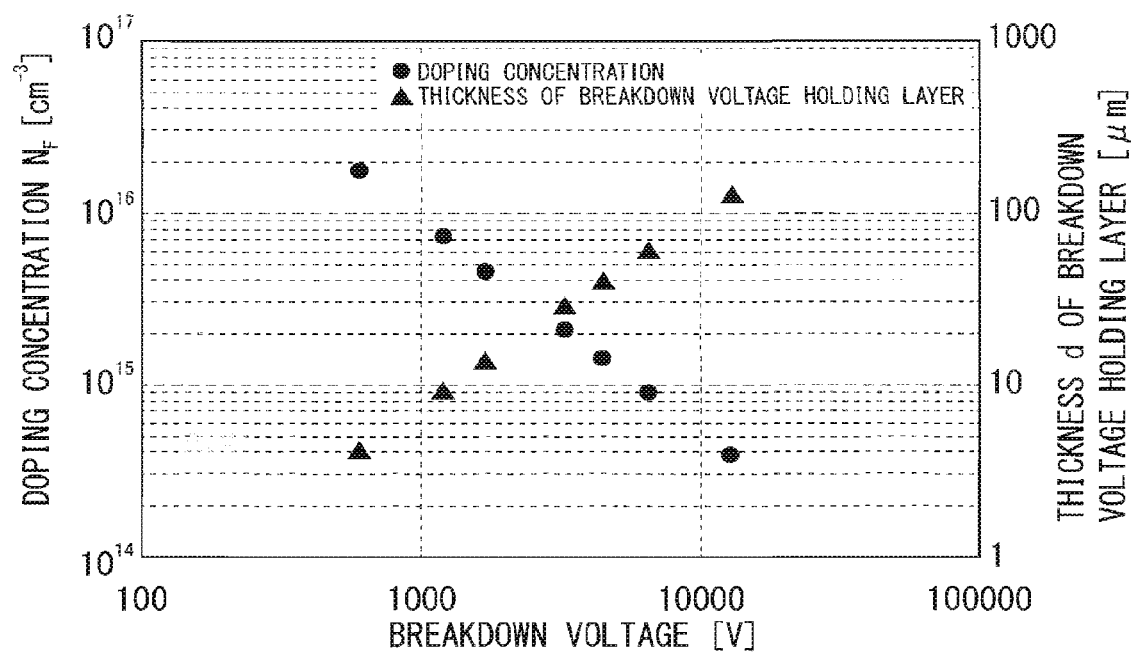
FIG. 13 is a diagram showing a relationship between the breakdown voltage and a doping concentration $N_F$ in a surface of the drift layer and a relationship between the breakdown voltage and a thickness of the breakdown voltage holding layer according to the embodiment.

FIG. 13 is a diagram showing a preferable relationship between the breakdown voltage of the semiconductor device and the doping concentration $N_F$ in the surface of the drift layer and a preferable relationship between the breakdown voltage of the semiconductor device and the thickness d of the breakdown voltage holding layer according to this embodiment. In FIG. 13, the left vertical axis, the right vertical axis, and the horizontal axis respectively represent the doping concentration [$cm^{-3}$], the thickness of the breakdown voltage holding layer [μm], and the (rated) breakdown voltage [V]. The left vertical axis and the right vertical axis respectively correspond to circles indicating the doping concentration and triangles indicating the thickness of the breakdown voltage holding layer.

By approximating the line connecting the circles in FIG. 13, $N_F = 4.58 \times 10^{19} V^{-1.23}$. A range of the doping concentration $N_F$ in a range of −20% to +20%, for example, can be assumed to be $$3.67 \times 10^{19} V^{-1.23} < N_F < 5.50 \times 10^{19} V^{-1.23}. \quad [\text{Math 3}]$$

By approximating the line connecting the triangles in FIG. 13, $d = 3.22 \times 10^{-3} V^{1.12}$. A range of the thickness d of the breakdown voltage holding layer in a range of −10% to +10%, for example, can be assumed to be $$2.90 \times 10^{-3} V^{1.12} < d < 3.55 \times 10^{-3} V^{1.12}. \quad [\text{Math 4}]$$

To manufacture a 600 V breakdown voltage product on purpose, it is sufficient that the doping concentration $N_F$ in the surface of the drift layer is approximately $1.58 \times 10^{16}$ $cm^{-3}$ to $1.93 \times 10^{16}$ $cm^{-3}$, and more preferably, approximately $1.66 \times 10^{16}$ $cm^{-3}$ to $1.84 \times 10^{16}$ $cm^{-3}$.

To manufacture the 600 V breakdown voltage product on purpose, it is sufficient that the thickness d of the breakdown voltage holding layer is approximately 3.87 μm to 4.27 μm, and more preferably, approximately 3.97 μm to 4.17 μm.

To manufacture the 600 V breakdown voltage product on purpose, the doping concentration $N_I$ is preferably greater than or equal to approximately $2 \times 10^{17}$ $cm^{-3}$.

To manufacture a 1200 V breakdown voltage product on purpose, it is sufficient that the doping concentration $N_F$ in the surface of the drift layer is approximately $6.48 \times 10^{16}$ $cm^{-3}$ to $7.92 \times 10^{16}$ $cm^{-3}$, and more preferably, approximately $6.84 \times 10^{16}$ $cm^{-3}$ to $7.56 \times 10^{16}$ $cm^{-3}$.

To manufacture the 1200 V breakdown voltage product on purpose, it is sufficient that the thickness d of the breakdown voltage holding layer is approximately 8.53 μm to 9.43 μm, and more preferably, approximately 8.76 μm to 9.20 μm.

To manufacture the 1200 V breakdown voltage product on purpose, the doping concentration $N_I$ is preferably greater than or equal to approximately $2 \times 10^{17}$ $cm^{-3}$, and the same effect can be obtained when the doping concentration $N_I$ is greater than or equal to approximately $1 \times 10^{17}$ $cm^{-3}$.

To manufacture a 1700 V breakdown voltage product on purpose, it is sufficient that the doping concentration $N_F$ in the surface of the drift layer is approximately $4.14 \times 10^{15}$ $cm^{-3}$ to $5.06 \times 10^{15}$ $cm^{-3}$, and more preferably, approximately $4.37 \times 10^{15}$ $cm^{-3}$ to $4.83 \times 10^{15}$ $cm^{-3}$.

To manufacture the 1700 V breakdown voltage product on purpose, it is sufficient that the thickness d of the breakdown voltage holding layer is approximately 12.65 μm to 13.99 μm, and more preferably, approximately 12.99 μm to 13.65 μm.

To manufacture the 1700 V breakdown voltage product on purpose, the doping concentration $N_I$ is preferably greater than or equal to approximately $2 \times 10^{17}$ $cm^{-3}$, and the same effect can be obtained when the doping concentration $N_I$ is greater than or equal to approximately $5 \times 10^{16}$ $cm^{-3}$.

To manufacture a 3300 V breakdown voltage product on purpose, it is sufficient that the doping concentration $N_F$ in the surface of the drift layer is approximately $1.84 \times 10^{15}$ $cm^{-3}$ to $2.24 \times 10^{15}$ $cm^{-3}$, and more preferably, approximately $1.94 \times 10^{15}$ $cm^{-3}$ to $2.14 \times 10^{15}$ $cm^{-3}$.

To manufacture the 3300 V breakdown voltage product on purpose, it is sufficient that the thickness d of the breakdown voltage holding layer is approximately 26.62 μm to 29.42 μm, and more preferably, approximately 27.32 μm to 28.72 μm.

To manufacture the 3300 V breakdown voltage product on purpose, the doping concentration $N_I$ is preferably greater than or equal to approximately $2 \times 10^{17}$ $cm^{-3}$, and the same effect can be obtained when the doping concentration $N_I$ is greater than or equal to approximately $2 \times 10^{16}$ $cm^{-3}$.

To manufacture a 4500 V breakdown voltage product on purpose, it is sufficient that the doping concentration $N_F$ in the surface of the drift layer is approximately $1.26 \times 10^{15}$ $cm^{-3}$ to $1.54 \times 10^{15}$ $cm^{-3}$, and more preferably, approximately $1.33 \times 10^{15}$ $cm^{-3}$ to $1.47 \times 10^{15}$ $cm^{-3}$.

To manufacture the 4500 V breakdown voltage product on purpose, it is sufficient that the thickness d of the breakdown voltage holding layer is approximately 37.50 μm to 41.44 μm, and more preferably, approximately 38.48 μm to 40.46 μm.

To manufacture the 4500 V breakdown voltage product on purpose, the doping concentration Ni is preferably greater than or equal to approximately $2 \times 10^{17}$ $cm^{-3}$, and the same effect can be obtained when the doping concentration $N_I$ is greater than or equal to approximately $1.5 \times 10^{16}$ $cm^{-3}$.

To manufacture a 6500 V breakdown voltage product on purpose, it is sufficient that the doping concentration $N_F$ in the surface of the drift layer is approximately $8.10 \times 10^{14}$ $cm^{-3}$ to $9.90 \times 10^{14}$ $cm^{-3}$, and more preferably, approximately $8.55 \times 10^{14}$ $cm^{-3}$ to $9.45 \times 10^{14}$ $cm^{-3}$.

To manufacture the 6500 V breakdown voltage product on purpose, it is sufficient that the thickness d of the breakdown voltage holding layer is approximately 56.31 μm to 62.23 μm, and more preferably, approximately 57.79 μm to 60.75 μm.

To manufacture the 6500 V breakdown voltage product on purpose, the doping concentration $N_I$ is preferably greater than or equal to approximately $2 \times 10^{17}$ $cm^{-3}$, and the same effect can be obtained when the doping concentration $N_I$ is greater than or equal to approximately $1 \times 10^{16}$ $cm^{-3}$.

To manufacture a 13000 V breakdown voltage product on purpose, it is sufficient that the doping concentration $N_F$ in the surface of the drift layer is approximately $3.51 \times 10^{14}$ $cm^{-3}$ to $4.29 \times 10^{14}$ $cm^{-3}$, and more preferably, approximately $3.71 \times 10^{14}$ $cm^{-3}$ to $4.10 \times 10^{14}$ $cm^{-3}$.

To manufacture the 13000 V breakdown voltage product on purpose, it is sufficient that the thickness d of the breakdown voltage holding layer is approximately 120.73 μm to 133.43 μm, and more preferably, approximately 123.90 μm to 130.26 μm.

To manufacture the 13000 V breakdown voltage product on purpose, the doping concentration $N_I$ is preferably greater than or equal to approximately $2 \times 10^{17}$ $cm^{-3}$, and the same effect can be obtained when the doping concentration $N_I$ is greater than or equal to approximately $4 \times 10^{15}$ cm$^{-3}$.

It suffices that the impurity concentration of the breakdown voltage holding layer continuously decreases, and the impurity concentration distribution in the depth direction may have a polygonal line shape.

FIG. 5 is a diagram showing a doping concentration distribution of the breakdown voltage holding layer having two linear concentration distribution layers. In FIG. 5, the vertical axis and the horizontal axis respectively represent a doping concentration $N_d$ and a depth x. A dotted line graph corresponding to f(x) described below and a solid line graph corresponding to $f_L(x)$ described below are each shown.

The drift layer 2 in FIG. 5 has a linear concentration distribution layer 2a formed on the surface side of the epitaxially grown drift layer 2 and a linear concentration distribution layer 2b formed on the substrate side of the drift layer 2. It is sufficient that the silicon carbide substrate 1 has the doping concentration $N_S$ of, for example, approximately $10^{17}$ cm$^{-3}$ to $10^{20}$ cm$^{-3}$, and more preferably, approximately $10^{18}$ cm$^{-3}$ to $10^{19}$ cm$^{-3}$.

$x_1-x_0$, which is a thickness of the linear concentration distribution layer 2a, may be equal to $x_2-x_1$, which is a thickness of the linear concentration distribution layer 2b, for the sake of simplicity, but they may be different from each other.

A relationship between each of the doping concentrations $f_L(x_i)$ (i=0, 1, 2) in the surface of the linear concentration distribution layer 2a, in the boundary between the linear concentration distribution layer 2a and the linear concentration distribution layer 2b, and in the bottom surface of the linear concentration distribution layer 2b, and the ideal doping concentration distribution expressed in the (expression 1) satisfies $$(1-P)f(x_i) \leq f_L(x_i) \leq (1+P)f(x_i) \qquad \text{[Math 5]}$$

where P represents the predetermined proportion. Each of the doping concentrations $f_L(x_i)$ may be set such that P is 20% (namely, 0.2), and more preferably, 10% (namely, 0.1).

FIG. 6 is a diagram showing a doping concentration distribution of the breakdown voltage holding layer having three linear concentration distribution layers. In FIG. 6, the vertical axis and the horizontal axis respectively represent the doping concentration $N_d$ and the depth x. A dotted line graph corresponding to f(x) described below and a solid line graph corresponding to $f_L(x)$ described below are each shown.

The breakdown voltage holding layer in FIG. 6 has a linear concentration distribution layer 2c formed on surface side of the epitaxially grown drift layer, a linear concentration distribution layer 2e formed on the substrate side of the drift layer 2, and a linear concentration distribution layer 2d sandwiched between the linear concentration distribution layer 2c and the linear concentration distribution layer 2e.

Also in the case where the number of linear concentration distribution layers is three as shown in FIG. 6, a relationship between each of the doping concentrations $f_L(x_i)$ (i=0, 1, 2, 3) in the surface of the linear concentration distribution layer 2c, in the boundary between the linear concentration distribution layer 2c and the linear concentration distribution layer 2d, in the boundary between the linear concentration distribution layer 2d and the linear concentration distribution layer 2e, and in the bottom surface of the linear concentration distribution layer 2e, and the ideal doping concentration distribution expressed in the (expression 1) satisfies $$(1-P)f(x_i) \leq f_L(x_i) \leq (1+P)f(x_i) \qquad \text{[Math 6]}$$

where P represents the predetermined proportion. Each of the doping concentrations $f_L(x_i)$ may be set such that P is 20% (namely, 0.2), and more preferably, 10% (namely, 0.1).

FIG. 7 is a diagram showing a doping concentration distribution of the breakdown voltage holding layer having four linear concentration distribution layers. In FIG. 7, the vertical axis and the horizontal axis respectively represent the doping concentration $N_d$ and the depth x. A dotted line graph corresponding to f(x) described below and a solid line graph corresponding to $f_L(x)$ described below are each shown.

The breakdown voltage holding layer in FIG. 7 has a linear concentration distribution layer 2i, a linear concentration distribution layer 2h, a linear concentration distribution layer 2g, and a linear concentration distribution layer 2f laminated in the stated order from the substrate side of the epitaxially grown drift layer toward the surface side of the drift layer.

Also in the case where the number of linear concentration distribution layers is four as shown in FIG. 7, a relationship between each of the doping concentrations $f_L(x_i)$ (i=0, 1, 2, 3, 4) in the surface of the linear concentration distribution layer 2f, in the boundary between the linear concentration distribution layer 2f and the linear concentration distribution layer 2g, in the boundary between the linear concentration distribution layer 2g and the linear concentration distribution layer 2h, in the boundary between the linear concentration distribution layer 2h and the linear concentration distribution layer 2i, and in the bottom surface of the linear concentration distribution layer 2i, and the ideal doping concentration distribution expressed in the (expression 1) satisfies $$(1-P)f(x_i) \leq f_L(x_i) \leq (1+P)f(x_i) \qquad \text{[Math 7]}$$

where P represents the predetermined proportion. Each of the doping concentrations $f_L(x_i)$ may be set such that P is 20% (namely, 0.2), and more preferably, 10% (namely, 0.1).

In this embodiment, the breakdown voltage holding layers each have the two, three, and four linear concentration distribution layers in the descriptions above, and the breakdown voltage holding layer may have more linear concentration distribution layers than those shown in this embodiment to a maximum of 20 layers. A greater number of linear concentration distribution layers clearly causes the actual doping concentration distribution $f_L(x)$ of the breakdown voltage holding layer to be brought closer to the doping concentration distribution f(x) ideal for reducing the drift resistance. Thus, the effect of reducing the drift resistance can be expected, and the effect of reducing the density of crystal defects becomes more remarkable.

The inventor has found from the results of diligent research that the effect of reducing the drift resistance and the effect of reducing the density of crystal defects sufficiently approach the effects calculated from the ideal doping concentration distribution by forming the 20 linear concentration distribution layers. In addition, increasing more layers than this vainly increases the number of steps and makes manufacturing difficult.

The variations in doping concentration due to the process stability of the epitaxial growth in each of the linear concentration distribution layers described above do not affect the characteristics of the semiconductor device, and the variations in doping concentration are acceptable.

<Manufacturing Method>

Next, a method for manufacturing the epitaxial substrate 100 in this embodiment is described.

First, the low-resistance silicon carbide substrate 1 of the n-type having an off-angle from a (0001) plane is prepared.

The low-resistance silicon carbide substrate 1 is doped with nitrogen as the dopant and has the doping concentration $N_S$ of a value around $10^{19}$ cm$^{-3}$.

Next, organic cleaning with acetone or the like is performed on the silicon carbide substrate 1. Then, the silicon carbide substrate 1 is cleaned with hydrochloric acid and hydrogen peroxide, or with ammonia and hydrogen peroxide, for example.

Next, the silicon carbide substrate 1 is disposed on a substrate holder of a chemical vapor deposition (CVD) device. After air is exhausted from a reactor of the CVD device, a reducing gas such as a hydrogen gas is introduced in the reactor such that the reactor has pressure in a range of 1 kPa to 70 kPa, for example, 25 kPa.

Then, high-frequency induction heating is performed on the substrate holder to heat the silicon carbide substrate 1 to a predetermined processing temperature, for example, 1450° C. After the temperature of the silicon carbide substrate 1 becomes stable, a supply of a source gas starts to start the epitaxial growth.

For the source gas, a silane gas, for example, is used as a Si-containing gas, and a propane gas, for example, is used as a carbon-containing gas. Moreover, a hydrogen gas or the like is used as a diluent gas.

For example, such a sequence that supplies of the silane gas of 9 sccm and the propane gas of 2.4 sccm simultaneously start is performed to start the epitaxial growth. In this case, a C-to-Si ratio being a supply ratio of carbon atoms to silicon atoms is approximately 0.8.

Nitrogen atoms doped as the dopant are supplied as a nitrogen gas. A concentration of the nitrogen atoms doped in the epitaxial layer depends on conditions for the epitaxial growth. When the nitrogen gas of 3.5 sccm is supplied under the above-mentioned conditions, the nitrogen is doped such that the epitaxial layer has a carrier concentration (electron concentration) of $10^{18}$ cm$^{-3}$. Also under the conditions, a growth speed of the epitaxial layer is approximately 60 nm per minute.

A thickness and a doping concentration distribution of each of the linear concentration distribution layers of the breakdown voltage holding layer can be set by appropriately modifying the conditions.

Therefore, the fixed amount of the silane gas and the propane gas is continuously supplied and the amount of supply of the nitrogen gas is temporarily decreased, to thereby epitaxially grow the drift layer.

After the drift layer having the predetermined thickness is epitaxially grown, the supplies of the silane gas, the propane gas, and the nitrogen gas are stopped, and an output of the high-frequency induction heating is reduced while only the diluent gas such as the hydrogen gas is supplied. Then, the temperatures of the substrate holder and the silicon carbide substrate 1 decrease, and the supply of the hydrogen gas is stopped when the temperature of the substrate holder reaches a temperature lower than 70° C. After the remaining hydrogen gas in the reactor is replaced with an argon gas or the like, the epitaxial substrate 100 is removed from the CVD device. In this manner, the epitaxial substrate 100 in this embodiment can be manufactured.

To grow the drift layer having the concentration of nitrogen temporarily decreased, the silane gas and the propane gas may be temporarily increased while the amount of the supply of the nitrogen gas is fixed. At this time, only a flow rate of the silane gas or the propane gas whose growth speed is limited may be increased, or flow rates of both of the gases may be increased at the same rate.

To increase the growth speed, a hydrogen chloride gas or a chlorine gas may be used as the source gas. For example, dichlorosilane, trichlorosilane, or the like may be used as a gas containing silicon atoms. Further, each source gas may be diluted to be used.

Moreover, when the epitaxial growth is performed on the condition that the C-to-Si ratio is low, the effect of allowing a blockage of defects, such as micropipes, included in the substrate can also be obtained.

Therefore, the flow rate of propane being the carbon atom supply gas is modified such that the C-to-Si ratio is low in the early stage of the epitaxial growth and the C-to-Si ratio is increased in the completion stage of the growth of the drift layer. Thus, a density of defects such as the micropipes occurring in the silicon carbide substrate 1 before the epitaxial growth can be reduced. The consumption of the carbon atom supply gas can also be reduced in this manner, thereby increasing productivity.

Furthermore, not only the C-to-Si ratio is increased during the growth of the drift layer, but also the amount of supply of the nitrogen gas may be increased with the C-to-Si ratio. Modifying the amount of supply of the nitrogen gas with the C-to-Si ratio allows for the formation of the drift layer having the predetermined proportion P further reduced.

While the nitrogen gas as a dopant raw material of the first conductivity type and a trimethylaluminum (TMA) gas as a dopant raw material of the second conductivity type are caused to flow simultaneously, a doping concentration may be controlled by a mixture ratio of the nitrogen gas and the TMA gas. This technique causes the dopant of the first conductivity type and the dopant of the second conductivity type to act opposite to each other in terms of an increase or a decrease in lattice constant. Thus, the technique can suppress distortion of the lattice constant of the crystals that are increased by the epitaxial growth, that is to say, the technique contributes to a decrease in density of the crystal defects.

<Effects>

As described above, the silicon carbide semiconductor device includes the silicon carbide substrate 1 of the first conductivity type and the breakdown voltage holding layer of the first conductivity type that is formed on the silicon carbide substrate 1, is doped with the dopant, and has the film thickness of d in this embodiment.

The breakdown voltage holding layer extends across the region from the point where the doping concentration of the dopant has the predetermined value (for example, a value of greater than or equal to $4 \times 10^{15}$ cm$^{-3}$ and less than or equal to $2 \times 10^{17}$ cm$^{-3}$) to the surface of the drift layer 2, and the doping concentration of the dopant continuously decreases in the film thickness direction. The breakdown voltage holding layer has the plurality of linear concentration distribution layers laminated in the film thickness direction. Each of the linear concentration distribution layers has the doping concentration decreased individually and linearly in the film thickness direction.

The ideal doping concentration distribution f(x) is expressed by $$f(x) = N_F \left\{ 1 - \left[ 1 - \left( \frac{N_F}{N_I} \right)^2 \right] \frac{x}{d} \right\}^{-1/2} \quad \text{[Math 8]}$$

$(0 \leq x \leq d),$ and the relationship between the doping concentration $f_L(x_i)$ at the end portions of each of the linear concentration distribution layers in the film thickness direction and the ideal doping concentration distribution f(x) is expressed by $$(1-P)f(x_i) \leq f_L(x_i) \leq (1+P)f(x_i) \qquad \text{[Math 9]}$$

where the x axis direction represents the film thickness direction, x=d represents the interface with the silicon carbide substrate 1, x=0 represents the surface of the drift layer 2, the doping concentration $N_F$ represents the doping concentration in the surface of the drift layer 2, the doping concentration $N_I$ represents the doping concentration in the interface with the silicon carbide substrate 1, and P represents the specific proportion of greater than or equal to 0 and less than or equal to 1.

This configuration can cause the doping concentration distribution of the breakdown voltage holding layer to approach the doping concentration distribution ideal for reducing the ON resistance by the achievable technique, so that the ON resistance can be reduced by approximately 25% at the maximum compared with the case where the breakdown voltage holding layer is formed at the uniform concentration.

Furthermore, the crystal defects caused by a difference in the lattice constant between the silicon carbide substrate and the drift layer can be prevented from being introduced in the drift layer. As a result, the decline in the quality of the crystals of the drift layer can be suppressed, so that yields are hardly reduced even when the drift layer having a great thickness is formed, and mobility of the carriers is also hardly reduced. The epitaxial substrate 100 and a semiconductor element having a low element resistance (drift resistance) can be obtained.

Figure 3:
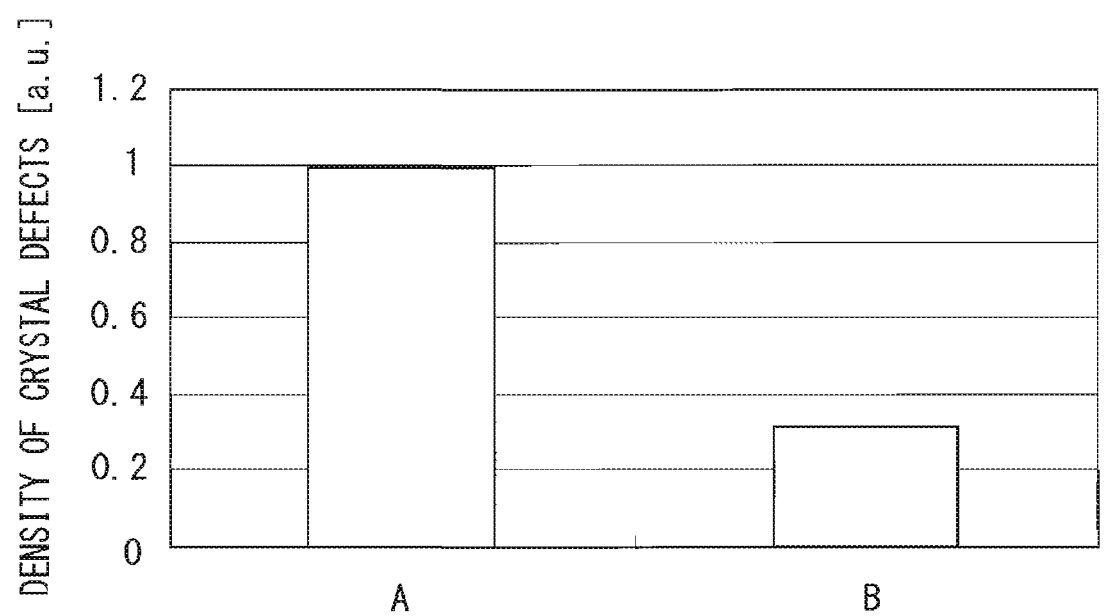
FIG. 3 is a diagram in which a density of crystal defects is compared between epitaxial substrates having the same breakdown voltage.

FIG. 3 is a diagram in which a density of crystal defects is compared between epitaxial substrates having the same breakdown voltage. In FIG. 3, a density of crystal defects (referred to as B in the diagram) of the epitaxial substrate 100 formed as described above is compared with a density of crystal defects (referred to as A in the diagram) of the epitaxial substrate formed by the epitaxial growth at the uniform doping concentration. They are each manufactured so as to have the same breakdown voltage. In FIG. 3, the vertical axis represents the density of crystal defects (a.u.).

For a drift layer epitaxially grown at the uniform doping concentration on a silicon carbide substrate, a difference in lattice constant due to a difference in doping concentration between the silicon carbide substrate and the drift layer causes distortion in the drift layer, and crystal defects are formed to release the distortion.

A lattice constant of an epitaxially grown drift layer having a doping concentration continuously decreased as in the drift layer 2 in this embodiment gradually changes in the film thickness direction, so that the distortion hardly occurs in the epitaxial crystals compared with the case where the drift layer is epitaxially grown at the uniform doping concentration. As a result, the density of crystal defects can be reduced.

Moreover, the drift layer can have the film thickness itself reduced by approximately 25% at the maximum more than the drift layer formed at the uniform doping concentration. This can also make the distortion in the epitaxial crystals hard to occur, thereby reducing the density of crystal defects. Further, the crystal defects caused by the distortion due to the difference in lattice constant between the silicon carbide substrate and the drift layer can be prevented from being introduced in the drift layer also in a silicon carbide semiconductor device having a higher breakdown voltage, which is important for the application.

The inventor has found another effect of the present invention from the diligent research that the structure according to the present invention has a higher resistance to variations in concentration of breakdown voltage than that of the structure including the breakdown voltage holding layer at the uniform doping concentration.

The semiconductor device disclosed in Patent Document 1 is a semiconductor device having a relatively low breakdown voltage, so that a resistance to variations in concentration of breakdown voltage is barely evident. A semiconductor device having a higher breakdown voltage needs a higher resistance to variations in concentration.

Figure 8:
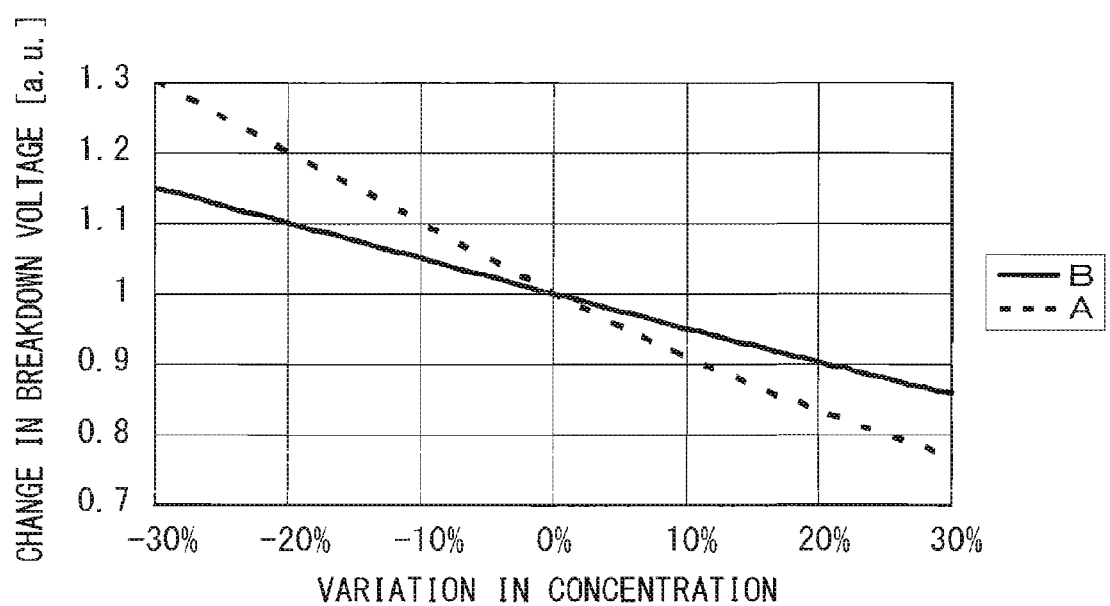
FIG. 8 is a diagram showing a change in breakdown voltage when variations in doping concentration occur in a drift layer.

FIG. 8 is a diagram showing a change in breakdown voltage when variations in doping concentration occur in the epitaxially grown drift layer. In FIG. 8, the vertical axis and the horizontal axis respectively represent the change in breakdown voltage (a.u.) and the variations in concentration. In FIG. 8, a breakdown voltage (A by a dotted line in FIG. 8) of the breakdown voltage holding layer formed by the epitaxial growth at the uniform doping concentration is compared with a breakdown voltage (B by a solid line in FIG. 8) of the breakdown voltage holding layer in the present invention.

As shown in FIG. 8, it is clear that the breakdown voltage holding layer in the present invention has the smaller change in breakdown voltage when the variations in concentration occur than the change of the breakdown voltage holding layer formed by the epitaxial growth at the uniform doping concentration. In other words, according to FIG. 8, it is clear that the breakdown voltage holding layer in the present invention can have a tolerance of the design of concentration approximately twice as much as that of the breakdown voltage holding layer formed by the epitaxial growth at the uniform doping concentration.

Figure 10:
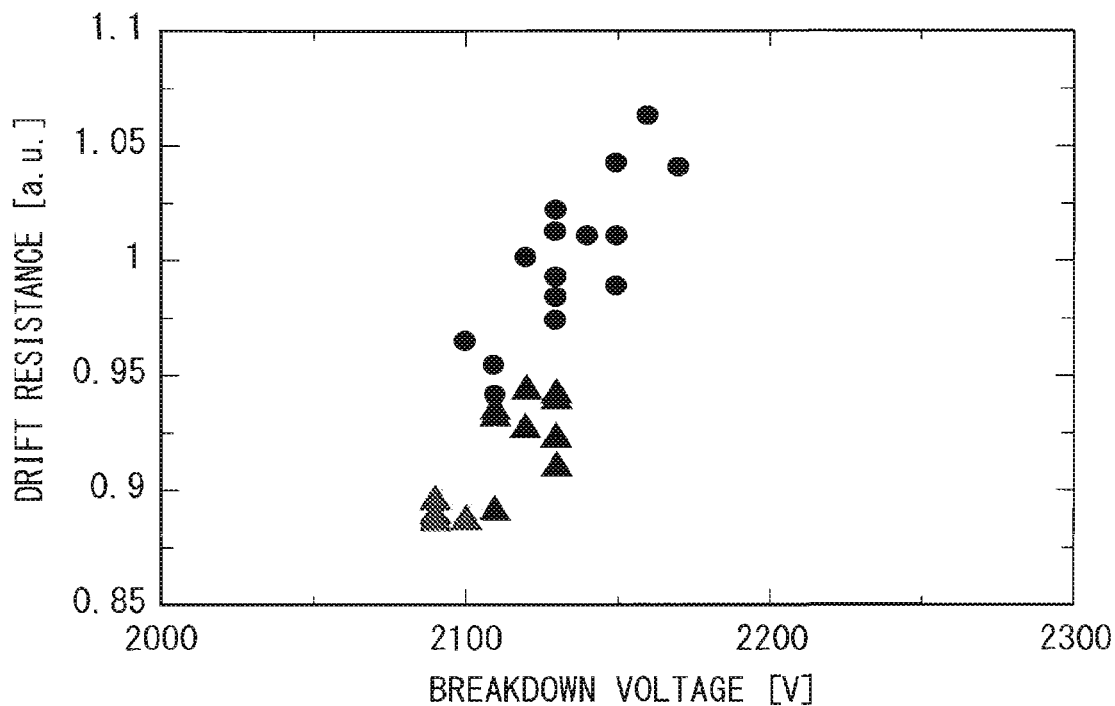
FIG. 10 is a diagram showing a relationship between the breakdown voltage and the drift resistance according to the embodiment.

FIG. 10 is a diagram of experimental results showing a relationship between drift resistance and breakdown voltage of a Schottky barrier diode (triangles) having the breakdown voltage holding layer structure in this embodiment and of a Schottky barrier diode (circles) having the breakdown voltage holding layer structure formed by the epitaxial growth at the uniform doping concentration. In FIG. 10, the vertical axis and the horizontal axis respectively represent the drift resistance [a.u.] and the breakdown voltage [V]. In FIG. 10, a combination of the doping concentration and the thickness of the epitaxial layer that may reduce the resistance to the lowest is selected for the breakdown voltage holding layer structure formed by the epitaxial growth at the uniform doping concentration under the limitation to the uniform doping concentration.

FIG. 10 shows verification that the breakdown voltage holding layer structure in this embodiment has the drift resistance reduced by approximately 10% in comparison with the breakdown voltage holding layer structure formed by the epitaxial growth at the uniform doping concentration at the same breakdown voltage.

FIG. 11 is a diagram of experimental results showing a relationship between the drift resistance and a reverse current of the Schottky barrier diode (triangles) having the breakdown voltage holding layer structure in this embodiment and of the Schottky barrier diode (circles) having the breakdown voltage holding layer structure formed by the epitaxial growth at the uniform doping concentration. In FIG. 11, the vertical axis and the horizontal axis respectively represent the drift resistance [a.u.] and the reverse current [A/cm$^2$]. In FIG. 11, a combination of the doping concentration and the thickness of the epitaxial layer that may reduce the resistance to the lowest is selected for the breakdown voltage holding layer structure formed by the epitaxial growth at the uniform doping concentration under the limitation to the uniform doping concentration.

FIG. 11 shows verification that the breakdown voltage holding layer structure in this embodiment has the drift resistance reduced by approximately 10% in comparison with the breakdown voltage holding layer structure formed by the epitaxial growth at the uniform doping concentration at the same reverse current. Additionally, this result shows that when the breakdown voltage holding layer structure in this embodiment is designed to have the same drift resistance as that of the breakdown voltage holding layer structure formed by the epitaxial growth at the uniform doping concentration, the reverse current is reduced, which contributes to the improvement of reliability of the device.

FIG. 12 is a diagram of experimental results showing temperature characteristics of the Schottky barrier diode (triangles) having the breakdown voltage holding layer structure in this embodiment and of the Schottky barrier diode (circles) having the breakdown voltage holding layer structure formed by the epitaxial growth at the uniform doping concentration. In FIG. 12, the vertical axis and the horizontal axis respectively represent the drift resistance [a.u.] and temperature [K]. In FIG. 12, a combination of the doping concentration and the thickness of the epitaxial layer that may reduce the resistance to the lowest is selected for the breakdown voltage holding layer structure formed by the epitaxial growth at the uniform doping concentration under the limitation to the uniform doping concentration.

As shown in FIG. 12, the difference in drift resistance between the breakdown voltage holding layer structure in this embodiment and the breakdown voltage holding layer structure formed by the epitaxial growth at the uniform doping concentration increases with increase in measurement temperature. For example, the reduction amount of drift resistance at the measurement at 100 C.° is three times as much as the reduction amount of drift resistance at the measurement at about ambient temperature. It is indicated that the breakdown voltage holding layer structure in this embodiment is more effective for the use at high temperature.

The concentration distribution of the breakdown voltage holding layer is not limited to this embodiment. In other words, the purpose of reducing the drift resistance can be achieved as long as the following points are satisfied. The silicon carbide semiconductor device includes the silicon carbide substrate 1 of the first conductivity type and the drift layer 2 of the first conductivity type that is formed on the silicon carbide substrate 1 and is doped with the dopant. The drift layer 2 has the doping concentration of the dopant continuously decreased from the point at the value of greater than or equal to $4\times10^{15}$ cm$^{-3}$ and less than or equal to $2\times10^{17}$ cm$^{-3}$ to the surface of the drift layer 2 in the film thickness direction toward the surface of the drift layer 2.

Second Embodiment (MOSFET, Modulated Epitaxy)

<Configuration>

Hereinafter, the same configuration as the configuration described in the embodiment above is denoted by the same references, and the detailed description will be appropriately omitted.

FIG. 4 is a cross-sectional view showing a configuration of a silicon carbide semiconductor element according to a second embodiment of the present invention. This embodiment includes a metal-oxide-semiconductor field-effect transistor (MOSFET) as an example of semiconductor elements.

Herein, the term "MOS" has been used for a laminated structure of a metal, an oxide, and a semiconductor. However, particularly for a field-effect transistor having a MOS structure (hereinafter may simply be referred to as a "MOS transistor"), materials for a gate insulating film and a gate electrode are improved in terms of integration and improvement on manufacturing processes in recent times.

For the MOS transistor, for example, polycrystalline silicon instead of metal has been used as the material for the gate electrode in terms of formation of mainly self-aligned source and drain. A high dielectric material is used as the material for the gate insulating film in terms of improvement on electrical characteristics, but the material is not necessarily limited to the oxide.

Accordingly, the use of the term "MOS" is not necessarily limited to only the laminated structure of the metal, oxide, and semiconductor, and this specification is not also predicated on such a limitation. In other words, in view of technical common sense, the "MOS" here is not only an abbreviation derived from the etymology, and the "MOS" has wide meanings including a laminated structure of an electric conductor, an insulator, and a semiconductor.

As shown in FIG. 4, a silicon carbide MOSFET 102 being the semiconductor element includes the epitaxial substrate 100 including the silicon carbide substrate 1 of the n-type that has the off-angle from the 4H—SiC(0001) plane and that has the low resistance and the drift layer 2 of the n-type formed on the silicon carbide substrate 1 by the epitaxial growth.

Further, a silicon carbide body region 14 of the p-type and a silicon carbide source region 15 of the n-type are selectively formed in the drift layer 2 by ion implantation and activation heat treatment.

A contact region 24 of the p-type is formed in the silicon carbide source region 15. A source electrode 20 is formed so as to cover the silicon carbide source region 15 and the contact region 24. A gate insulating film 17 is formed so as to cover the silicon carbide source region 15, the silicon carbide body region 14, and the drift layer 2, and a gate electrode 18 is formed on top of them.

An interlayer insulating film 19 is formed so as to cover the gate insulating film 17, the gate electrode 18, and the silicon carbide source region 15 that is not covered with (that is exposed from) the source electrode 20 and the gate insulating film 17.

Further, wiring 22 is formed so as to cover the interlayer insulating film 19 and the source electrode 20. Meanwhile, a drain electrode 21 is formed on the back surface of the silicon carbide substrate 1.

The silicon carbide body region 14 has a layer thickness of approximately 0.5 μm to 2 μm and a doping concentration of approximately $3\times10^{17}$ cm$^{-3}$ to $20\times10^{17}$ cm$^{-3}$. An outermost surface of the silicon carbide body region 14 in which a channel is formed or to which a channel is brought close may have a reduced doping concentration. Reducing the doping concentration in the outermost surface of the silicon carbide body region 14 reduces a scattering of impurities and increases mobility of the carriers in the channel, so that the element resistance can be reduced. An outermost region of the contact region 24 of the silicon carbide body region 14 may be separately selectively ion-implanted so as to be doped at a concentration of approximately $5\times10^{18}$ cm$^{-3}$ to $50\times10^{18}$ cm$^{-3}$ higher than that of the other portions.

The silicon carbide source region 15 has a layer thickness of approximately 0.3 μm to 1 μm and a doping concentration of approximately $5 \times 10^{18}$ cm$^{-3}$ to $50 \times 10^{18}$ cm$^{-3}$.

The gate insulating film 17 is formed on the layer structure, and the gate electrode 18 is formed on top of them, and thus a gate portion is manufactured.

The silicon carbide MOSFET 102 shown in FIG. 4 does not include a channel layer, but the channel layer may be separately provided. In a case where the channel layer is provided, its conductivity type may be the n-type or the p-type. The channel layer is preferably formed by, for example, the epitaxial growth in order to improve roughness of the surface caused by the activation heat treatment of the ion implantation species, but the channel layer having less roughness of the surface caused by the activation heat treatment may be formed by selective ion implantation. The activation heat treatment of the ion implantation species may be collectively performed, or the activation heat treatment may be performed in each implantation step.

The gate insulating film 17 is achieved by forming a silicon oxide film, a silicon nitride film, or the like by thermal oxidation or nitriding performed on the silicon carbide semiconductor. Alternatively, the gate insulating film 17 is achieved by forming and depositing the insulating film. Alternatively, both of them may be performed. Part of the gate insulating film 17 facing a region 34, which is formed to be the channel, of the silicon carbide body region is formed so as to have a thickness of approximately 10 nm to 100 nm.

The gate electrode 18 is formed by forming a polycrystalline silicon film or a metal film. The channel layer (not shown), the gate insulating film 17, and the gate electrode 18 in the region except for the gate portion are removed. The channel layer in the region except for the gate portion may be removed before the gate insulating film 17 is formed.

After the interlayer insulating film 19 is formed, the interlayer insulating film in the region, which is formed to be a contact portion of the source electrode 20, is removed, and the source electrode 20 is then formed. Further, the drain electrode 21 is formed on the back surface of the silicon carbide substrate 1, and the wiring 22 is formed on the source electrode 20 and the interlayer insulating film 19. It is not shown but the wiring 22 on the interlayer insulating film 19 is removed from part of the region of the peripheral portion of the element including a gate electrode pad.

The breakdown voltage holding layer that is a layer extending from the point where the doping concentration of the dopant has the predetermined value (for example, a value of greater than or equal to $3 \times 10^{15}$ cm$^{-3}$ and less than or equal to $1 \times 10^{17}$ cm$^{-3}$) to the surface of the drift layer 2 in this embodiment has the doping concentration of the dopant continuously decreased from the point at the predetermined value (for example, a value of greater than or equal to $3 \times 10^{15}$ cm$^{-3}$ and less than or equal to $1 \times 10^{17}$ cm$^{-3}$) to a modulation point located further toward the surface of the drift layer 2 than a midpoint in the film thickness direction of the breakdown voltage holding layer. The breakdown voltage holding layer has the doping concentration continuously increased from the modulation point to the surface of the drift layer 2. The breakdown voltage holding layer can include the plurality of linear concentration distribution layers laminated in the film thickness direction.

Herein, the surface of the drift layer 2 is the lower surface of the silicon carbide body region 14 in this embodiment. The doping concentration during the epitaxial growth from the depth of the lower surface of the silicon carbide body region 14 to the surface of the epitaxial layer is approximately $3 \times 10^{14}$ cm$^{-3}$ to $3 \times 10^{18}$ cm$^{-3}$, for example.

A JFET region 35 sandwiched between the silicon carbide body regions 14 adjacent to each other is formed in the silicon carbide MOSFET shown in FIG. 4. The JFET region 35 and the body region 14 are cyclically formed. The JFET region 35 is discretely formed in the y direction and the z direction, which are two plane directions perpendicular to the x axis being the film thickness direction of the breakdown voltage holding layer. The JFET region 35 conceivably has a resistance increased by narrowing a current path. In this case, the doping concentration during the epitaxial growth from the depth of the lower surface of the silicon carbide body region 14 to the surface of the epitaxial layer is preferably set to be higher than the doping concentration in the surface of the drift layer 2. Alternatively, the doping concentration in the JFET region is preferably set to be higher than the doping concentration in the surface of the drift layer 2 by implanting the impurity ions of the first conductivity type.

In both cases, it is sufficient that the doping concentration at least in the JFET region 35 is increased, and it is more preferred that the JFET region 35 is formed deeper than the silicon carbide body region 14. Further, in the case where the doping concentration is increased by the implantation, it is more preferred that a current limiting region 36 is formed so as to include part of the lower surface of the silicon carbide body region 14. In this case, a spreading resistance that spreads from the JFET region 35 toward the drift layer 2 can be reduced.

Figure 18:
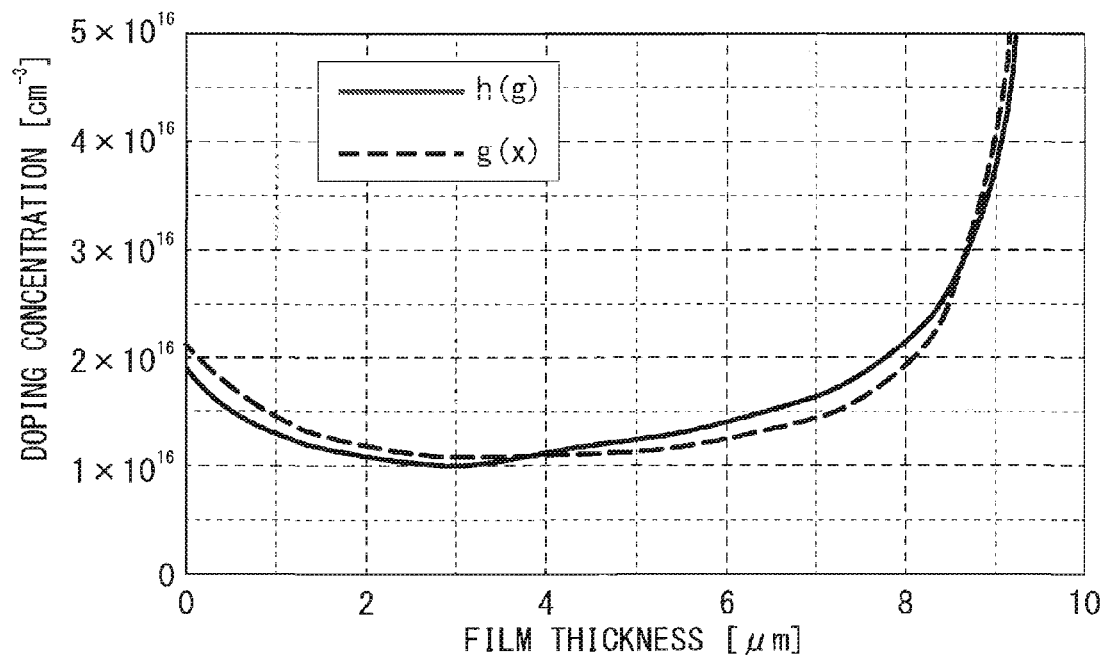
FIG. 18 is a diagram showing a concentration distribution of the breakdown voltage holding layer according to the embodiment.

FIG. 18 is a diagram showing a concentration distribution of the breakdown voltage holding layer having the structure of the present invention. In the diagram, the vertical axis and the horizontal axis respectively represent a doping concentration $N_d$ [cm$^{-3}$] and a depth x [μm]. A dotted line graph corresponding to an ideal concentration distribution h(x) and a solid line graph corresponding to g(x) are each shown in the diagram.

The concentration distribution of the breakdown voltage holding layer is not limited to this embodiment. In other words, the purpose of reducing the drift resistance can be achieved as long as the following points are satisfied. The silicon carbide substrate 1 of the first conductivity type and the drift layer 2 of the first conductivity type that is formed on the silicon carbide substrate 1 and is doped with the dopant are provided. The drift layer 2 includes the breakdown voltage holding layer having the film thickness of d from the point where the doping concentration of the dopant has the predetermined value (for example, greater than or equal to $3 \times 10^{15}$ cm$^{-3}$ and less than or equal to $1 \times 10^{17}$ cm$^{-3}$) to the surface of the drift layer 2. The doping concentration of the dopant continuously decreases in the film thickness direction of the breakdown voltage holding layer toward the surface of the drift layer 2 from the point where the doping concentration of the dopant in the breakdown voltage holding layer has the predetermined value (for example, greater than or equal to $3 \times 10^{15}$ cm$^{-3}$ and less than or equal to $1 \times 10^{17}$ cm$^{-3}$) to the modulation point located further toward the surface of the drift layer 2 than the midpoint in the film thickness direction of the breakdown voltage holding layer. The doping concentration of the dopant continuously increases in the film thickness direction of the breakdown voltage holding layer toward the surface of the drift layer 2 from the modulation point to the surface of the drift layer 2.

The doping concentration at the point where the doping concentration has the predetermined value is preferably greater than or equal to $3 \times 10^{15}$ cm$^{-3}$ and less than or equal to $1\times10^{17}$ cm$^{-3}$. A distance from the modulation point to the surface of the drift layer 2 is preferably less than or equal to ⅓ of the film thickness of the breakdown voltage holding layer.

When a distance from the modulation point to the surface of the drift layer 2 is d$_{min}$, the drift layer 2 has the doping concentration of the dopant continuously decreased from the point of the film thickness d to the point (modulation point) where the film thickness from the surface of the drift layer 2 is d$_{min}$, and the drift layer 2 has the doping concentration of the dopant continuously increased from the point (modulation point) where the film thickness from the surface of the drift layer 2 is d$_{min}$ to the surface of the drift layer 2.

For example, for cells arranged in stripes, when $0\le x<d_{min}$, an ideal doping concentration distribution h (N$_F$, L$_{fp}$, L$_j$, x) is expressed by $$\frac{dh}{dx} = -\frac{(L_j+2x)\lambda}{2L_{fp}}h^3 - \frac{h}{L_j+2x},\quad\text{[Math 10]}$$

when $d_{min} \le x < d$, the ideal doping concentration distribution h (N$_F$, L$_{fp}$, L$_j$, x) is expressed by $$\frac{dh}{dx} = -\frac{\lambda}{2}h^3,\quad\text{[Math 11]}$$

and a relationship between the concentration distribution g(x) of the breakdown voltage holding layer and the ideal doping concentration distribution h (N$_F$, L$_{fp}$, L$_j$, x) expressed in the relational expressions is expressed by $$(1-P)h(N_F,L_{fp},L_j,x) < g(x) < (1+P)h(N_F,L_{fp},L_j,x)\quad\text{[Math 12]}$$

where the drift layer 2 is set such that x=0 represents the surface of the drift layer 2, the doping concentration N$_F$ represents the doping concentration in the surface of the drift layer 2, L$_{fp}$ represents an arrangement pitch of the silicon carbide body regions 14 of the second conductivity type formed at an interval from each other in the surface layer of the drift layer 2, L$_j$ represents a width of the JFET region 35 of the first conductivity type located between the silicon carbide body regions 14 adjacent to each other, and P represents a specific proportion of greater than or equal to 0 and less than or equal to 1. Herein, λ represents a negative value that defines the concentration distribution, and λ is preferably greater than or equal to $-1\times10^{-37}$ m$^5$C$^2$/V$^2$F$^2$ and less than or equal to $-1\times10^{-39}$ m$^5$C$^2$/V$^2$F$^2$.

For example, for cells arranged in a lattice pattern, when $0\le x<d_{min}$, an ideal doping concentration distribution k (N$_F$, L$_{fp2}$, L$_{j2}$, x) is expressed by $$\frac{dk}{dx} = -\frac{\lambda}{2L_{fp2}^2}(L_{j2}+2x)(L_{j2}+2x-2L_{fp2})k^3 +\quad\text{[Math 13]}$$
$$\frac{2(L_{fp2}-L_{j2}-2x)}{(L_{j2}+2x)(L_{j2}+2x-2L_{fp2})}k,$$

when $d_{min} \le x < d$, the ideal doping concentration distribution k (N$_F$, L$_{fp2}$, L$_{j2}$, x) is expressed by $$\frac{dk}{dx} = -\frac{\lambda}{2}k^3,\quad\text{[Math 14]}$$

and a relationship between the concentration distribution g(x) of the breakdown voltage holding layer and the ideal doping concentration distribution k (N$_F$, L$_{fp2}$, L$_{j2}$, x) expressed in the relational expressions is expressed by $$(1-P)k(N_F,L_{fp2},L_{j2},x) < g(x) < (1+P)k(N_F,L_{fp2},L_{j2},x)\quad\text{[Math 15]}$$

where the drift layer 2 is set such that x=0 represents the surface of the drift layer 2, the doping concentration N$_F$ represents the doping concentration in the surface of the drift layer 2, L$_{fp2}$ represents an arrangement pitch of the silicon carbide body regions 14 of the second conductivity type that overlap the upper portion of the drift layer 2 and that are formed at an interval from each other in the surface layer of the drift layer 2, L$_{j2}$ represents a width of the JFET region 35 of the first conductivity type located between the silicon carbide body regions 14 adjacent to each other, and P represents a specific proportion of greater than or equal to 0 and less than or equal to 1. Herein, λ represents a negative value that defines the concentration distribution, and λ is preferably greater than or equal to $-1\times10^{-37}$ m$^5$C$^2$/V$^2$F$^2$ and less than or equal to $-1\times10^{-39}$ m$^5$C$^2$/V$^2$F$^2$.

The predetermined proportion P is a value with consideration given to variations in concentration of impurities in the process by the epitaxial growth. It is sufficient that the predetermined proportion P is 20% (namely, 0.2), and more preferably, 10% (namely, 0.1). A smaller value of the predetermined proportion P causes an actual doping concentration distribution to be brought closer to the doping concentration distribution h(x) or k(x) ideal for reducing the drift resistance. Thus, the effect of reducing the drift resistance can be expected.

Figure 19:
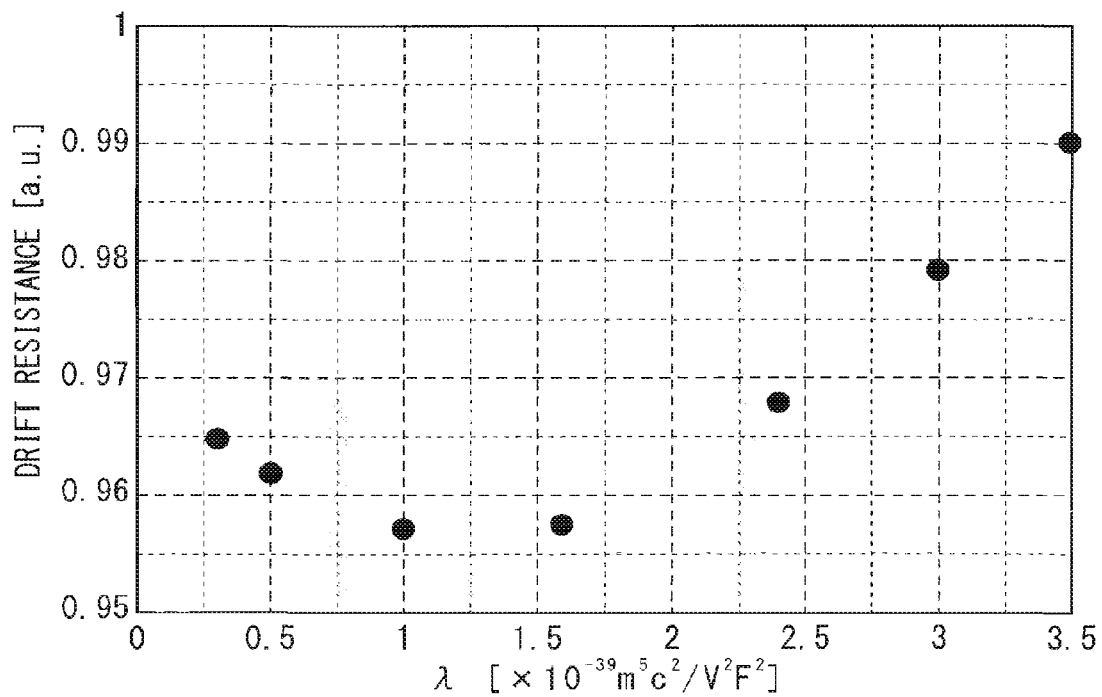
FIG. 19 is a diagram showing a relationship between an element resistance and a negative value λ that defines a concentration distribution according to the embodiment.

FIG. 19 is a diagram showing an example of a relationship between the negative value λ that defines a preferable concentration distribution at a fixed breakdown voltage and the resistance in this embodiment. In FIG. 19, the vertical axis and the horizontal axis respectively represent the drift resistance [a.u.] of the semiconductor element and the negative value λ [$\times10^{-39}$ m$^5$C$^2$/V$^2$F$^2$] that defines the concentration distribution. As clearly seen from FIG. 19, the negative value λ that defines the preferable concentration distribution having a minimum resistance is shown.

Figure 20:
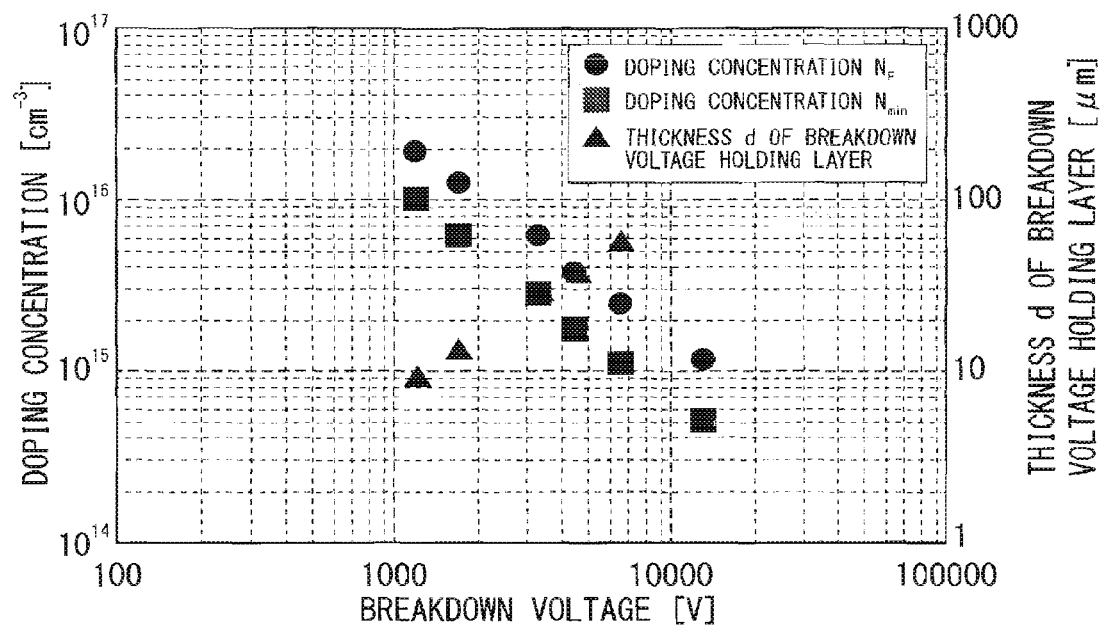
FIG. 20 is a diagram showing a relationship between the breakdown voltage and the doping concentration $N_F$ in the surface of the drift layer, a relationship between the breakdown voltage and the doping concentration $N_{min}$ in $d_{min}$ and a relationship between the breakdown voltage and the thickness of the breakdown voltage holding layer according to the embodiment.

FIG. 20 is a diagram showing a preferable relationship between the breakdown voltage of the semiconductor device and the doping concentration N$_F$ in the surface of the drift layer 2, a preferable relationship between the breakdown voltage of the semiconductor device and the doping concentration N$_{min}$ in d$_{min}$, which is the film thickness from the surface of the drift layer 2 to the modulation point, and a preferable relationship between the breakdown voltage of the semiconductor device and the thickness d of the breakdown voltage holding layer in this embodiment. In FIG. 20, the left vertical axis, the right vertical axis, and the horizontal axis respectively represent the doping concentration [cm$^{-3}$], the thickness of the breakdown voltage holding layer [μm], and the breakdown voltage [V]. In FIG. 20, the left vertical axis corresponds to circles indicating the doping concentration N$_F$ and rectangles indicating the doping concentration N$_{min}$, and the right vertical axis corresponds to triangles indicating the thickness of the breakdown voltage holding layer.

By approximating the line connecting the circles in FIG. 20, N$_F$=8.52$\times10^{19}$ V$^{-1.19}$. A range of the doping concentration N$_F$ in a range of −20% to +20%, for example, can be assumed to be $$6.82\times10^{19}\text{ V}^{-1.9} < N_F < 10.2\times10^{19}\text{ V}^{-1.19}.\quad\text{[Math 16]}$$

By approximating the line connecting the triangles in FIG. 20, $d=3.78\times10^{-3}$ $V^{1.10}$. A range of the thickness d of the breakdown voltage holding layer in a range of −10% to +10%, for example, can be assumed to be $$3.40\times10^{-3}\ V^{1.10} < d < 4.16\times10^{-3}\ V^{1.10}. \quad [\text{Math 17}]$$

Figure 21:
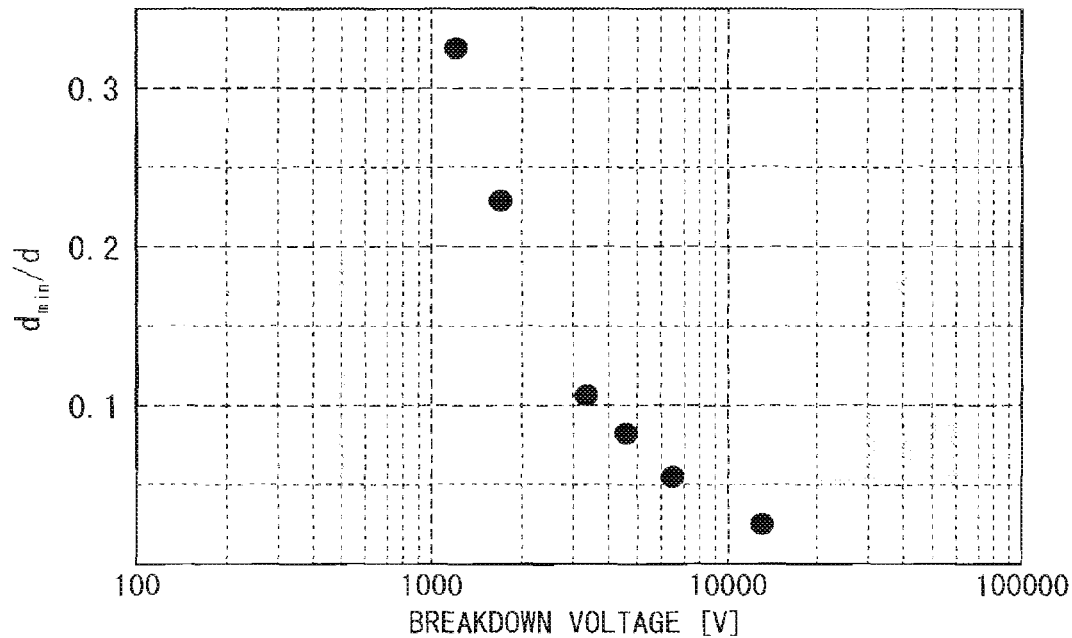
FIG. 21 is a diagram showing a relationship between the breakdown voltage and $d_{min}/d$ according to the embodiment.

FIG. 21 is a diagram showing a relationship between the breakdown voltage of the semiconductor device and $d_{min}/d$ being a preferable ratio of $d_{min}$, which is the film thickness from the surface of the drift layer 2 to the modulation point, to the film thickness d of the breakdown voltage holding layer in this embodiment. In FIG. 21, the vertical axis represents $d_{min}/d$ being the ratio of $d_{min}$, which is the film thickness from the surface of the drift layer 2 to the modulation point, to the film thickness d of the breakdown voltage holding layer, and the horizontal axis represents the breakdown voltage [V].

Figure 22:
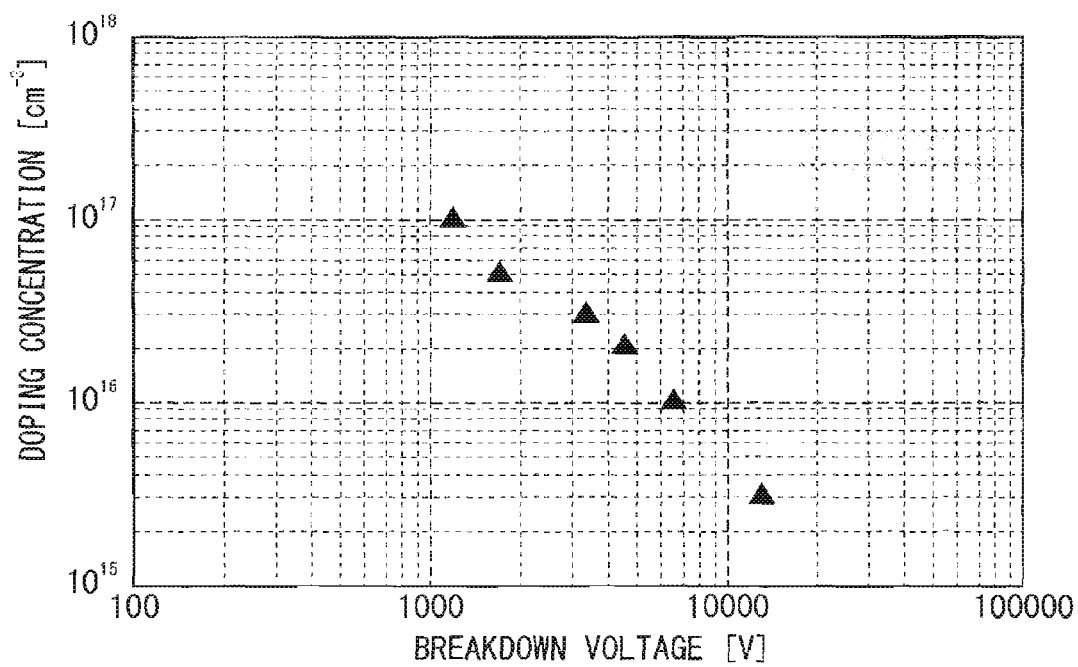
FIG. 22 is a diagram showing a relationship between the breakdown voltage and a doping concentration at an end on a substrate side of the breakdown voltage holding layer according to the embodiment.

FIG. 22 is a diagram showing a relationship between the breakdown voltage of the semiconductor device and a preferable predetermined doping concentration at an end on the substrate side of the breakdown voltage holding layer in this embodiment. In FIG. 22, the vertical axis and the horizontal axis respectively represent the doping concentration [$cm^{-3}$] and the breakdown voltage [V].

To manufacture a 1200 V breakdown voltage product having the cells arranged in stripes on purpose, assuming that $L_{fp}=7.4$ μm and $L_j=1.4$ μm, for example, it is sufficient that the negative value λ defining the concentration distribution takes on values approximately in a range of $-1.0\times10^{-39}$ $m^5C^2/V^2F^2$ to $-2.0\times10^{-39}$ $m^5C^2/V^2F^2$.

In a case where the negative value λ defining the concentration distribution is approximately $-1.5\times10^{-39}$ $m^5C^2/V^2F^2$ among the values, for example, it is sufficient that the doping concentration $N_F$ in the surface of the drift layer 2 is approximately $1.74\times10^{16}$ $cm^{-3}$ to $2.12\times10^{16}$ $cm^{-3}$, and more preferably, approximately $1.83\times10^{16}$ $cm^{-3}$ to $2.03\times10^{16}$ $cm^{-3}$.

In this case, it is sufficient that the thickness d of the breakdown voltage holding layer is approximately 8.75 μm to 9.67 μm, for example, and more preferably, approximately 8.98 μm to 9.44 μm. It is sufficient that $d_{min}$ being the film thickness from the surface of the drift layer 2 to the modulation point is approximately 2.85 μm to 3.15 μm, and more preferably, approximately 2.925 μm to 3.075 μm. It is sufficient that the doping concentration $N_{min}$ in $d_{min}$ being the film thickness from the surface of the drift layer 2 to the modulation point is approximately $9.18\times10^{15}$ $cm^{-3}$ to $1.12\times10^{16}$ $cm^{-3}$, and more preferably, approximately $9.69\times10^{15}$ $cm^{-3}$ to $1.07\times10^{16}$ $cm^{-3}$.

To manufacture a 1700 V breakdown voltage product having the cells arranged in stripes on purpose, assuming that $L_{fp}=7.4$ μm and $L_j=1.4$ μm, for example, it is sufficient that the negative value λ defining the concentration distribution takes on values approximately in a range of $-1.8\times10^{-39}$ $m^5C^2/V^2F^2$ to $-3.2\times10^{-39}$ $m^5C^2/V^2F^2$.

In a case where the negative value λ defining the concentration distribution is approximately $-2.5\times10^{-39}$ $m^5C^2/V^2F^2$ among the values, for example, it is sufficient that the doping concentration $N_F$ in the surface of the drift layer 2 is approximately $1.13\times10^{16}$ $cm^{-3}$ to $1.39\times10^{16}$ $cm^{-3}$, and more preferably, approximately $1.20\times10^{16}$ $cm^{-3}$ to $1.32\times10^{16}$ $cm^{-3}$.

In this case, it is sufficient that the thickness d of the breakdown voltage holding layer is approximately 12.50 μm to 13.82 μm, for example, and more preferably, approximately 12.83 μm to 13.49 μm. It is sufficient that $d_{min}$ being the film thickness from the surface of the drift layer 2 to the modulation point is approximately 2.85 μm to 3.15 μm, and more preferably, approximately 2.925 μm to 3.075 μm. It is sufficient that the doping concentration $N_{min}$ in $d_{min}$ being the film thickness from the surface of the drift layer 2 to the modulation point is approximately $5.61\times10^{15}$ $cm^{-3}$ to $6.85\times10^{15}$ $cm^{-3}$, and more preferably, approximately $5.92\times10^{15}$ $cm^{-3}$ to $6.54\times10^{15}$ $cm^{-3}$.

To manufacture a 3300 V breakdown voltage product having the cells arranged in stripes on purpose, assuming that $L_{fp}=7.4$ μm and $L_j=1.4$ μm, for example, it is sufficient that the negative value λ defining the concentration distribution takes on values approximately in a range of $-4.6\times10^{-39}$ $m^5C^2/V^2F^2$ to $-7.3\times10^{-39}$ $m^5C^2/V^2F^2$.

In a case where the negative value % defining the concentration distribution is approximately $-6.0\times10^{-39}$ $m^5C^2/V^2F^2$ among the values, for example, it is sufficient that the doping concentration $N_F$ in the surface of the drift layer 2 is approximately $5.12\times10^{15}$ $cm^{-3}$ to $6.26\times10^{15}$ $cm^{-3}$, and more preferably, approximately $5.41\times10^{15}$ $cm^{-3}$ to $5.97\times10^{15}$ $cm^{-3}$.

In this case, it is sufficient that the thickness d of the breakdown voltage holding layer is approximately 25.64 μm to 28.34 μm, for example, and more preferably, approximately 26.32 μm to 27.66 μm. It is sufficient that $d_{min}$ being the film thickness from the surface of the drift layer 2 to the modulation point is approximately 2.85 μm to 3.15 μm, and more preferably, approximately 2.925 μm to 3.075 μm. It is sufficient that the doping concentration $N_{min}$ in $d_{min}$ being the film thickness from the surface of the drift layer 2 to the modulation point is approximately $2.36\times10^{15}$ $cm^{-3}$ to $2.89\times10^{15}$ $cm^{-3}$, and more preferably, approximately $2.49\times10^{15}$ $cm^{-3}$ to $2.76\times10^{15}$ $cm^{-3}$.

To manufacture a 4500 V breakdown voltage product having the cells arranged in stripes on purpose, assuming that $L_{fp}=7.4$ μm and $L_j=1.4$ μm, for example, it is sufficient that the negative value λ defining the concentration distribution takes on values approximately in a range of $-7.1\times10^{-39}$ $m^5C^2/V^2F^2$ to $-1.09\times10^{-38}$ $m^5C^2/V^2F^2$.

In a case where the negative value λ defining the concentration distribution is approximately $-9.0\times10^{-39}$ $m^5C^2/V^2F^2$ among the values, for example, it is sufficient that the doping concentration $N_F$ in the surface of the drift layer 2 is approximately $3.53\times10^{15}$ $cm^{-3}$ to $4.31\times10^{15}$ $cm^{-3}$, and more preferably, approximately $3.72\times10^{15}$ $cm^{-3}$ to $4.12\times10^{15}$ $cm^{-3}$.

In this case, it is sufficient that the thickness d of the breakdown voltage holding layer is approximately 36.00 μm to 39.80 μm, for example, and more preferably, approximately 36.95 μm to 38.85 μm. It is sufficient that $d_{min}$ being the film thickness from the surface of the drift layer 2 to the modulation point is approximately 2.85 μm to 3.15 μm, and more preferably, approximately 2.925 μm to 3.075 μm. It is sufficient that the doping concentration $N_{min}$ in $d_{min}$ being the film thickness from the surface of the drift layer 2 to the modulation point is approximately $1.60\times10^{15}$ $cm^{-3}$ to $1.95\times10^{15}$ $cm^{-3}$, and more preferably, approximately $1.69\times10^{15}$ $cm^{-3}$ to $1.87\times10^{15}$ $cm^{-3}$.

To manufacture a 6500 V breakdown voltage product having the cells arranged in stripes on purpose, assuming that $L_{fp}=7.4$ μm and $L_j=1.4$ μm, for example, it is sufficient that the negative value λ defining the concentration distribution takes on values approximately in a range of $-1.23\times10^{-38}$ $m^5C^2/V^2F^2$ to $-1.77\times10^{-38}$ $m^5C^2/V^2F^2$.

In a case where the negative value λ defining the concentration distribution is approximately $-1.5\times10^{-38}$ $m^5C^2/V^2F^2$ among the values, for example, it is sufficient that the doping concentration $N_F$ in the surface of the drift layer 2 is approximately $2.24\times10^{15}$ cm$^{-3}$ to $2.74\times10^{15}$ cm$^{-3}$, and more preferably, approximately $2.37\times10^{15}$ cm$^{-3}$ to $2.61\times10^{15}$ cm$^{-3}$.

In this case, it is sufficient that the thickness d of the breakdown voltage holding layer is approximately 53.69 µm to 59.35 µm, for example, and more preferably, approximately 55.11 µm to 57.93 µm. It is sufficient that $d_{min}$ being the film thickness from the surface of the drift layer 2 to the modulation point is approximately 2.85 µm to 3.15 µm, and more preferably, approximately 2.925 µm to 3.075 µm. It is sufficient that the doping concentration $N_{min}$ in $d_{min}$ being the film thickness from the surface of the drift layer 2 to the modulation point is approximately $9.99\times10^{14}$ cm$^{-3}$ to $1.22\times10^{13}$ cm$^{-3}$, and more preferably, approximately $1.05\times10^{15}$ cm$^{-3}$ to $1.17\times10^{15}$ cm$^{-3}$.

To manufacture a 13000 V breakdown voltage product having the cells arranged in stripes on purpose, assuming that $L_{fp}$=7.4 µm and $L_j$=1.4 µm, for example, it is sufficient that the negative value λ defining the concentration distribution takes on values approximately in a range of $-2.46\times10^{-38}$ m$^5$C$^2$/V$^2$F$^2$ to $-3.54\times10^{-38}$ m$^5$C$^2$/V$^2$F$^2$.

In a case where the negative value λ defining the concentration distribution is approximately $-3.0\times10^{-38}$ m$^5$C$^2$/V$^2$F$^2$ among the values, for example, it is sufficient that the doping concentration $N_F$ in the surface of the drift layer 2 is approximately $1.04\times10^{15}$ cm$^{-3}$ to $1.28\times10^{15}$ cm$^{-3}$, and more preferably, approximately $1.10\times10^{15}$ cm$^{-3}$ to $1.22\times10^{15}$ cm$^{-3}$.

In this case, it is sufficient that the thickness d of the breakdown voltage holding layer is approximately 119.89 µm to 132.51 µm, for example, and more preferably, approximately 123.04 µm to 129.36 µm. It is sufficient that $d_{min}$ being the film thickness from the surface of the drift layer 2 to the modulation point is approximately 2.85 µm to 3.15 µm, and more preferably, approximately 2.925 µm to 3.075 µm. It is sufficient that the doping concentration $N_{min}$ in $d_{min}$ being the film thickness from the surface of the drift layer 2 to the modulation point is approximately $4.60\times10^{14}$ cm$^{-3}$ to $5.62\times10^{14}$ cm$^{-3}$, and The variations in doping concentration due to the process stability of the epitaxial growth do not affect the characteristics of the semiconductor device, and the variations in doping concentration are acceptable.

<Effects>

As described above, according to this embodiment, the silicon carbide semiconductor device includes the silicon carbide substrate 1 of the first conductivity type and the breakdown voltage holding layer of the first conductivity type that is formed on the silicon carbide substrate 1, is doped with the dopant, and has the film thickness of d.

The concentration of the drift layer 2 continuously decreases from the point of the film thickness d to the point $d_{min}$, which is the film thickness from the surface of the drift layer 2 to the modulation point, and the drift layer 2 continuously increases from the point (modulation point) of $d_{min}$ to the surface of the drift layer 2.

For example, for the cells arranged in the stripes, when $0\leq x<d_{min}$, the ideal doping concentration distribution h ($N_F$, $L_{fp}$, $L_j$, x) is expressed by $$\frac{dh}{dx} = -\frac{(L_j+2x)\lambda}{2L_{fp}}h^3 - \frac{h}{L_j+2x},$$ [Math 18]

when $d_{min}\leq x<d$, the ideal doping concentration distribution h ($N_F$, $L_{fp}$, $L_j$, x) is expressed by $$\frac{dh}{dx} = -\frac{\lambda}{2}h^3,$$ [Math 19]

and the relationship between the concentration distribution g(x) of the breakdown voltage holding layer and the ideal doping concentration distribution h ($N_F$, $L_{fp}$, $L_j$, x) expressed in the relational expressions is expressed by $$(1-P)h(N_F,L_{fp},L_j,x)<g(x)<(1+P)h(N_F,L_{fp},L_j,x)$$ [Math 20]

where the drift layer 2 is set such that x=0 represents the surface of the drift layer 2, the doping concentration $N_F$ represents the doping concentration in the surface of the drift layer 2, $L_{fp}$ represents the arrangement pitch of the silicon carbide body regions 14 of the second conductivity type that overlap the upper portion of the breakdown voltage holding layer and that are formed at the interval from each other, $L_j$ represents the width of the JFET region 35 of the first conductivity type located between the silicon carbide body regions 14 adjacent to each other, and P represents the specific proportion of greater than or equal to 0 and less than or equal to 1. Herein, λ represents any value (constant) that defines the concentration distribution.

For example, for the cells arranged in the lattice pattern, when $0\leq x<d_{min}$, an ideal doping concentration distribution k ($N_F$, $L_{fp2}$, $L_{j2}$, x) is expressed by $$\frac{dk}{dx} = -\frac{\lambda}{2L_{fp2}^2}(L_{j2}+2x)(L_{j2}+2x-2L_{fp2})k^3 + \frac{2(L_{fp2}-L_{j2}-2x)}{(L_{j2}+2x)(L_{j2}+2x-2L_{fp2})}k,$$ [Math 21]

when $d_{min}\leq x<d$, the ideal doping concentration distribution k ($N_F$, $L_{fp2}$, $L_{j2}$, x) is expressed by $$\frac{dk}{dx} = -\frac{\lambda}{2}k^3,$$ [Math 22]

a relationship between the concentration distribution g(x) of the breakdown voltage holding layer and the ideal doping concentration distribution k ($N_F$, $L_{fp2}$, $L_{j2}$, x) expressed in the relational expressions is expressed by $$(1-P)k(N_F,L_{fp2},L_{j2},x)<g(x)<(1+P)k(N_F,L_{fp2},L_{j2},x)$$ [Math 23]

where the drift layer 2 is set such that x=0 represents the surface of the drift layer 2, the doping concentration $N_F$ represents the doping concentration in the surface of the drift layer 2, $L_{fp2}$ represents an arrangement pitch of the silicon carbide body regions 14 of the second conductivity type that overlap the upper portion of the breakdown voltage holding layer and that are formed at an interval from each other, $L_{j2}$ represents a width of the JFET region 35 of the first conductivity type located between the silicon carbide body regions 14 adjacent to each other, and P represents the specific proportion of greater than or equal to 0 and less than or equal to 1. Herein, λ represents any value (constant) that defines the concentration distribution.

This configuration can cause the doping concentration distribution of the breakdown voltage holding layer to approach the doping concentration distribution ideal for reducing the ON resistance by the achievable technique, so that the ON resistance can be reduced by approximately 25% at the maximum compared with the case where the breakdown voltage holding layer is formed at the uniform concentration.

Figure 23:
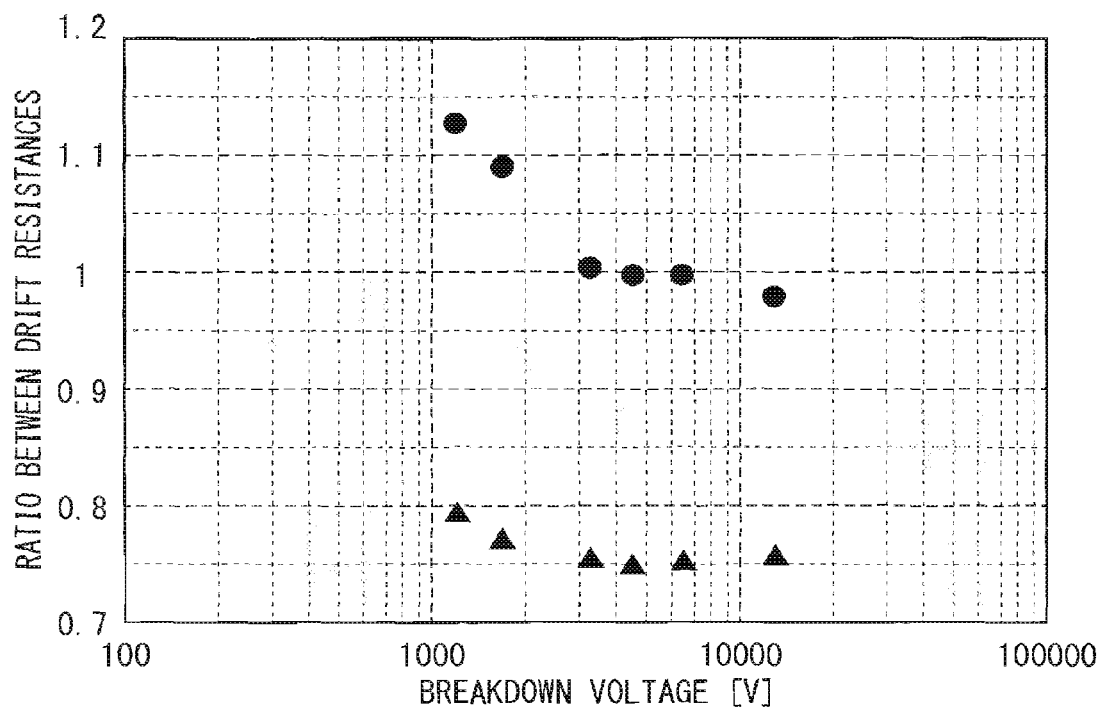
FIG. 23 is a diagram showing a relationship between the breakdown voltage and the drift resistance according to the embodiment.

FIG. 23 is a diagram showing a relationship between the breakdown voltage and the drift resistance in this embodiment. In FIG. 23, the horizontal axis represents the breakdown voltage [V]. In FIG. 23, the vertical axis represents a ratio of the drift resistance of the MOSFET including the breakdown voltage holding layer at the uniform doping concentration to the drift resistance of the MOSFET including the breakdown voltage holding layer having the doping concentration distribution of this embodiment (triangles), and the vertical axis also represents a ratio of the drift resistance of the MOSFET including the breakdown voltage holding layer at the uniform doping concentration to the drift resistance of the MOSFET including the breakdown voltage holding layer having the doping concentration distribution of the first embodiment (circles).

As clearly seen from FIG. 23, the sufficient effect of reducing the resistance by the technique described in the first embodiment is not promising in the device having the portion narrowing the current path as in this embodiment.

For example, in the case where the 1200 V breakdown voltage product is manufactured on purpose, the drift resistance of the MOSFET including the breakdown voltage holding layer having the doping concentration distribution of this embodiment is reduced by approximately 20% from the drift resistance of the MOSFET including the breakdown voltage holding layer at the uniform doping concentration while the drift resistance of the MOSFET including the breakdown voltage holding layer having the doping concentration distribution of the first embodiment is increased by approximately 13% from the drift resistance of the MOSFET including the breakdown voltage holding layer at the uniform doping concentration.

To make the effects in this embodiment clear, the effect of reducing the resistance by doping the impurities of the first conductivity type into the JFET region 35 is omitted from FIG. 23.

Figure 24:
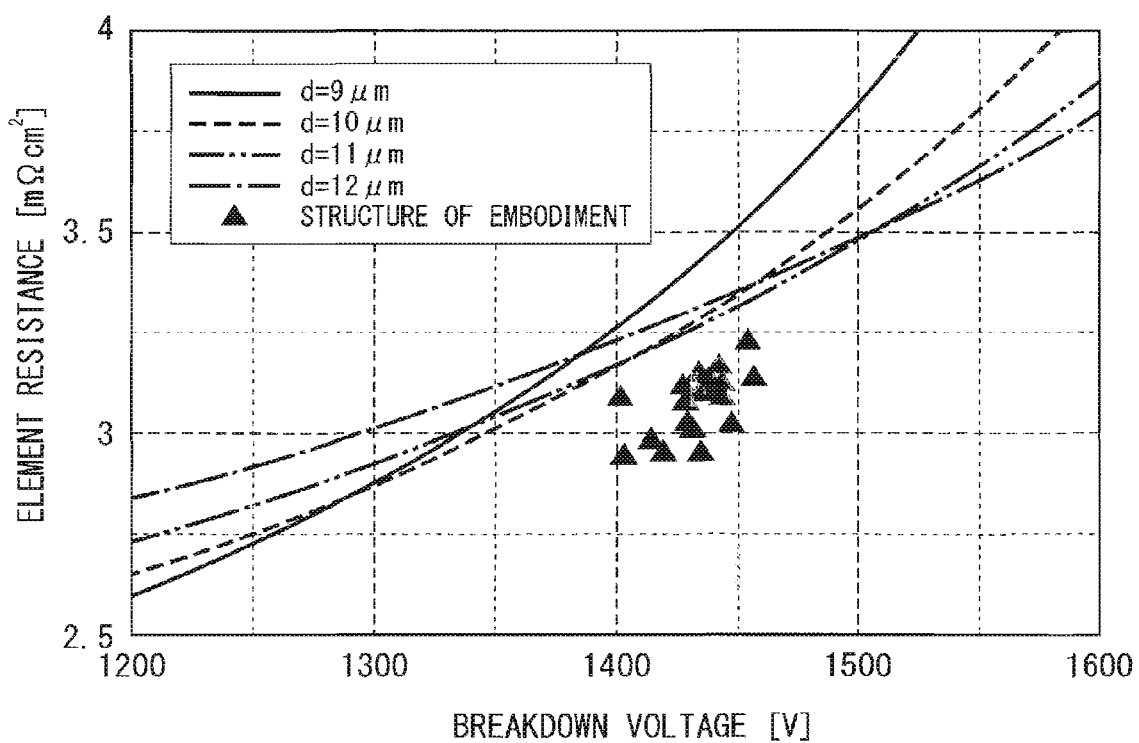
FIG. 24 is a diagram showing a relationship between the breakdown voltage and an element resistance according to the embodiment.

FIG. 24 is a diagram of experimental results showing relationships between the element resistance and the breakdown voltage of the MOSFET having the breakdown voltage holding layer structure in this embodiment (triangles) and the MOSFET having the breakdown voltage holding layer structure formed by the epitaxial growth at the uniform doping concentration (curves). In FIG. 24, the vertical axis and the horizontal axis respectively represent the element resistance [mΩ cm$^2$] and the breakdown voltage [V]. In FIG. 24, the breakdown voltage holding layer structure formed by the epitaxial growth at the uniform doping concentration has a film thickness d of 9 μm, 10 μm, 11 μm, and 12 μm respectively indicated by a solid line, a dotted line, a chain double-dashed line, and an alternate long and short dashed line. In FIG. 24, a combination of the doping concentration and the thickness of the epitaxial layer that may reduce the resistance to the lowest is selected for the breakdown voltage holding layer structure formed by the epitaxial growth at the uniform doping concentration under the limitation to the uniform doping concentration.

FIG. 24 shows verification that the breakdown voltage holding layer structure in this embodiment has the drift resistance reduced in comparison with the breakdown voltage holding layer structure formed by the epitaxial growth at the uniform doping concentration at the same breakdown voltage.

The concentration distribution of the breakdown voltage holding layer is not limited to this embodiment. In other words, the silicon carbide substrate 1 of the first conductivity type and the drift layer 2 of the first conductivity type that is formed on the silicon carbide substrate 1 and that is doped with the dopant are provided. Further, the plurality of silicon carbide body regions 14 of the second conductivity type formed at the interval from each other in the surface layer of the drift layer 2 may be provided. In this case, the region sandwiched between the plurality of body regions in the surface layer of the drift layer 2 is the JFET region 35, and the JFET region 35 and the silicon carbide body region 14 are cyclically formed. The purpose of reducing the drift resistance can be achieved as long as the following points are satisfied. The drift layer 2 includes the breakdown voltage holding layer having the film thickness d from the point where the doping concentration of the dopant has the predetermined value (for example, greater than or equal to $3\times10^{15}$ cm$^{-3}$ and less than or equal to $1\times10^{17}$ cm$^{-3}$) to the surface of the drift layer 2. The doping concentration of the dopant in the breakdown voltage holding layer continuously decreases in the film thickness direction of the breakdown voltage holding layer toward the surface of the drift layer 2 from the point where the doping concentration of the dopant in the breakdown voltage holding layer has the predetermined value (for example, greater than or equal to $3\times10^{15}$ cm$^{-3}$ and less than or equal to $1\times10^{17}$ cm$^{-3}$) to the modulation point located further toward the surface of the drift layer 2 than the midpoint in the film thickness direction of the breakdown voltage holding layer. The doping concentration of the dopant in the breakdown voltage holding layer continuously increases in the film thickness direction of the breakdown voltage holding layer toward the surface of the drift layer 2 from the modulation point to the surface of the drift layer 2.

The predetermined doping concentration at the point where the doping concentration has the predetermined value is preferably greater than or equal to $3\times10^{15}$ cm$^{-3}$ and less than or equal to $1\times10^{17}$ cm$^{-3}$. A distance from the modulation point to the surface of the drift layer 2 is preferably less than or equal to ⅓ of the film thickness of the breakdown voltage holding layer.

Third Embodiment (MOSFET, Inclined Epitaxy)

<Configuration>

This embodiment is a modification of the first embodiment. Hereinafter, the same configuration as the configuration described in the embodiments above is denoted by the same references, and the detailed description will be appropriately omitted.

FIG. 4 is a cross-sectional view showing a configuration of a silicon carbide semiconductor element according to a third embodiment of the present invention. This embodiment includes a metal-oxide-semiconductor field-effect transistor (MOSFET) as an example of semiconductor elements.

A breakdown voltage holding layer has the same configuration as that shown in the first embodiment. The breakdown voltage holding layer extends from the point where the doping concentration has the value of greater than or equal to $4\times10^{15}$ cm$^{-3}$ and less than or equal to $2\times10^{17}$ cm$^{-3}$ to the surface of the drift layer 2, and the doping concentration of the dopant continuously decreases in the film thickness direction toward the surface of the drift layer 2.

Herein, the surface of the drift layer 2 is the lower surface of the silicon carbide body region 14 in this embodiment. The doping concentration during the epitaxial growth from the depth of the lower surface of the silicon carbide body region 14 to the surface of the epitaxial layer is approximately $3\times10^{14}$ cm$^{-3}$ to $3\times10^{18}$ cm$^{-3}$, for example.

The JFET region 35 sandwiched between the silicon carbide body regions 14 adjacent to each other is formed in the silicon carbide MOSFET shown in FIG. 4. The JFET region 35 conceivably has a resistance increased by narrowing a current path. In this case, the doping concentration during the epitaxial growth from the depth of the lower surface of the silicon carbide body region 14 to the surface of the epitaxial layer is preferably set to be higher than the doping concentration in the surface of the drift layer 2. Alternatively, the doping concentration in the JFET region 35 is preferably set to be higher than the doping concentration in the surface of the drift layer 2 by implanting the impurity ions of the first conductivity type.

In both cases, it is sufficient that the doping concentration at least in the JFET region 35 is increased, and it is more preferred that the JFET region 35 is formed deeper than the silicon carbide body region 14. Further, in the case where the doping concentration is increased by the implantation, it is more preferred that the current limiting region 36 is formed so as to include part of the lower surface of the silicon carbide body region 14. In this case, a spreading resistance that spreads from the JFET region 35 toward the drift layer 2 can be reduced.

<Effects>

This configuration can cause the doping concentration distribution of the breakdown voltage holding layer to approach the doping concentration distribution ideal for reducing the ON resistance by the achievable technique, so that the drift resistance can be reduced by approximately 25% at the maximum. Further, the introduction of the crystal defects caused by the difference in lattice constant between the silicon carbide substrate 1 and the drift layer 2 can be suppressed. Thus, an increase in element resistance can be suppressed without decreasing the mobility of the carriers.

Fourth Embodiment (pn Diode, Inclined Epitaxy)

<Configuration>

This embodiment is a modification of the first embodiment. Hereinafter, the same configuration as the configuration described in the embodiments above is denoted by the same references, and the detailed description will be appropriately omitted.

Figure 14:
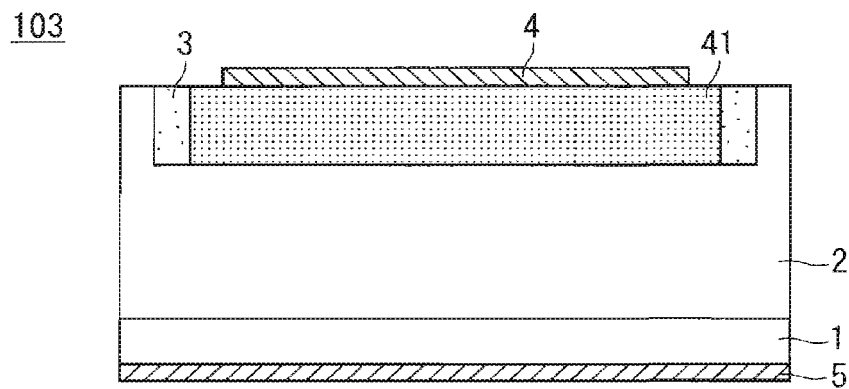
FIG. 14 is a cross-sectional view showing a configuration of a silicon carbide semiconductor element according to an embodiment.

FIG. 14 is a cross-sectional view showing a configuration of a silicon carbide semiconductor element according to this embodiment. This embodiment includes a pn diode as an example of semiconductor elements.

A decrease in resistance by the effect of modulating conductivity by electrons and holes flowing at the same time can be intrinsically expected in the pn diode. However, minority carriers have a short life, which is inherent in the silicon carbide semiconductor, so that a resistance of the semiconductor element is actually determined by conductivity of almost only majority carriers. In other words, the effect of reducing a drift resistance by the breakdown voltage holding layer structure in this embodiment can be estimated also in this embodiment similar to the other embodiments.

As shown in FIG. 14, a silicon carbide pn diode 103 being the semiconductor element includes the epitaxial substrate 100 including the silicon carbide substrate 1 of the n-type that has the off-angle from the 4H—SiC(0001) plane and that has the low resistance and including the drift layer 2 of the n-type formed on the silicon carbide substrate 1 by the epitaxial growth. A breakdown voltage holding layer has the same configuration as that in the first embodiment.

Furthermore, a silicon carbide anode region 41 of the p-type, which is the second conductivity type, is formed on the drift layer 2 by the epitaxial growth or the ion implantation.

The p-type region 3 is formed as the termination structure in the peripheral portion of the element of the silicon carbide pn diode 103. The p-type region 3 is selectively formed in the drift layer 2 of the epitaxial substrate 100 by the ion implantation and the activation heat treatment. The p-type region 3 is formed so as to have a layer thickness of approximately 0.5 μm to 2 μm and a doping concentration of approximately $10^{17}$ cm$^{-3}$ to $10^{19}$ cm$^{-3}$.

The anode electrode 4 is formed on the silicon carbide anode region 41 of the p-type. Further, the cathode electrode 5 is formed on the back surface of the silicon carbide substrate 1 having the low resistance. The silicon carbide anode region 41 of the p-type is in ohmic contact with the anode electrode 4.

In this embodiment, the surface of the drift layer 2 is the lower surface of the silicon carbide anode region 41 of the p-type. The doping concentration during the epitaxial growth from the depth of the lower surface of the silicon carbide anode region 41 to the surface of the epitaxial layer is approximately $3\times10^{14}$ cm$^{-3}$ to $3\times10^{18}$ cm$^{-3}$, for example.

<Effects>

This configuration can cause the doping concentration distribution of the breakdown voltage holding layer to approach the doping concentration distribution ideal for reducing the ON resistance by the achievable technique, so that the drift resistance can be reduced by approximately 25% at the maximum. Further, the introduction of the crystal defects caused by the difference in lattice constant between the silicon carbide substrate 1 and the drift layer 2 can be suppressed. Thus, an increase in element resistance can be suppressed without decreasing the mobility of the carriers.

Fifth Embodiment (JBS, Inclined Epitaxy+Modulated Epitaxy)

<Configuration>

This embodiment is a modification of the first embodiment or the second embodiment. Hereinafter, the same configuration as the configuration described in the embodiments above is denoted by the same references, and the detailed description will be appropriately omitted.

Figure 15:
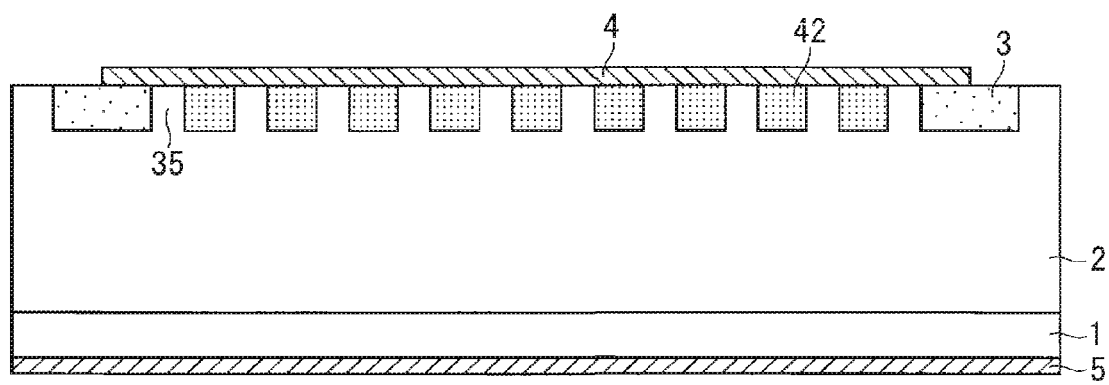
FIG. 15 is a cross-sectional view showing a configuration of a silicon carbide semiconductor element according to an embodiment.

FIG. 15 is a cross-sectional view showing a configuration of a silicon carbide semiconductor element according to this embodiment. This embodiment includes a junction barrier Schottky-diode (JBS) as an example of semiconductor elements.

As shown in FIG. 15, a silicon carbide JBS 104 being the semiconductor element includes the epitaxial substrate 100 including the silicon carbide substrate 1 of the n-type that has the off-angle from the 4H—SiC(0001) plane and that has the low resistance and including the drift layer 2 of the n-type formed on the silicon carbide substrate 1 by the epitaxial growth. In addition, a breakdown voltage holding layer has the same configuration as that of the first embodiment or the second embodiment.

Furthermore, electric field relaxation regions 42 of the p-type, which is the second conductivity type, are formed on the drift layer 2 by the ion implantation.

The p-type region 3 is formed as the termination structure in the peripheral portion of the element of the silicon carbide JBS 104. The p-type region 3 is selectively formed in the drift layer 2 of the epitaxial substrate 100 by the ion implantation and the activation heat treatment. The p-type region 3 is formed so as to have a layer thickness of approximately 0.5 μm to 2 μm and a doping concentration of approximately $10^{17}$ cm$^{-3}$ to $10^{19}$ cm$^{-3}$.

The anode electrode 4 is formed across the drift layer 2 and the p-type region 3. Further, the cathode electrode 5 is formed on the back surface of the silicon carbide substrate 1 having the low resistance.

The electric field relaxation regions 42 of the p-type may be in Schottky contact or ohmic contact with the anode electrode 4. In the case where the electric field relaxation regions 42 of the p-type are in ohmic contact with the anode electrode 4, a decrease in resistance by the effect of modulating conductivity by electrons and holes flowing at the same time can be expected. However, minority carriers have a short life, which is inherent in the silicon carbide semiconductor, so that a resistance of the semiconductor element is actually determined by conductivity of almost only majority carriers. In other words, the effect of reducing a drift resistance by the breakdown voltage holding layer structure in this embodiment can be estimated also in this embodiment similar to the other embodiments.

Herein, the surface of the drift layer 2 is the lower surface of the electric field relaxation region 42 of the p-type. The doping concentration during the epitaxial growth from the depth of the lower surface of the electric field relaxation region 42 to the surface of the epitaxial layer is approximately $3 \times 10^{14}$ cm$^{-3}$ to $3 \times 10^{18}$ cm$^{-3}$, for example.

The JFET region 35 sandwiched between the electric field relaxation regions 42 of the p-type adjacent to each other is formed in the silicon carbide JBS shown in FIG. 15. The JFET region 35 conceivably has a resistance increased by narrowing a current path. In this case, the doping concentration during the epitaxial growth from the depth of the lower surface of the electric field relaxation region 42 of the p-type to the surface of the epitaxial layer is preferably set to be higher than the doping concentration in the surface of the drift layer 2. Alternatively, the doping concentration in the JFET region is preferably set to be higher than the doping concentration in the surface of the drift layer 2 by implanting the impurity ions of the first conductivity type.

In both cases, it is sufficient that the doping concentration at least in the JFET region 35 is increased, and it is more preferred that the JFET region 35 is formed deeper than the electric field relaxation region 42 of the p-type. Further, in the case where the doping concentration is increased by the implantation, it is more preferred that the current limiting region 36 is formed so as to include part of the lower surface of the electric field relaxation region 42 of the p-type. In this case, a spreading resistance that spreads from the JFET region 35 toward the drift layer 2 can be reduced.

<Effects>

This configuration can cause the doping concentration distribution of the breakdown voltage holding layer to approach the doping concentration distribution ideal for reducing the ON resistance by the achievable technique, so that the drift resistance can be reduced by approximately 25% at the maximum. Further, the introduction of the crystal defects caused by the difference in lattice constant between the silicon carbide substrate 1 and the drift layer 2 can be suppressed. Thus, an increase in element resistance can be suppressed without decreasing the mobility of the carriers.

Sixth Embodiment (Buffer Layer, Inclined Epitaxy+Modulated Epitaxy)

<Configuration>

This embodiment is a modification of the second embodiment or the third embodiment. Hereinafter, the same configuration as the configuration described in the embodiments above is denoted by the same references, and the detailed description will be appropriately omitted.

Figure 16:
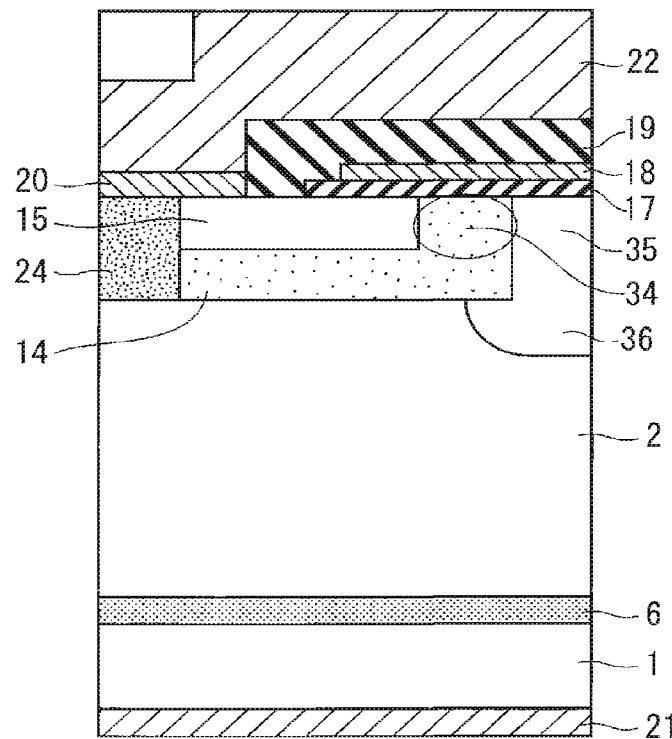
FIG. 16 is a cross-sectional view showing a configuration of a silicon carbide semiconductor element according to an embodiment.

FIG. 16 is a cross-sectional view showing a configuration of a silicon carbide semiconductor element according to this embodiment. This embodiment includes a MOSFET as an example of semiconductor elements, and the same effects can be obtained in another silicon carbide semiconductor device.

The configuration of the silicon carbide MOSFET described in the second embodiment or the third embodiment additionally includes a crystal defect suppressing layer 6 located between the silicon carbide substrate 1 and the drift layer 2. For example, for the crystal defect suppressing layer 6 having a thickness of 60 nm, it is sufficient that a layer 6a with a thickness of 20 nm on the drift layer 2 side of the crystal defect suppressing layer 6 has a doping concentration of greater than or equal to $2.6 \times 10^{18}$ cm$^{-3}$ and less than or equal to $4.0 \times 10^{18}$ cm$^{-3}$ while a layer 6b with a thickness of 40 nm on the silicon carbide substrate 1 side of the crystal defect suppressing layer 6 has a doping concentration of greater than or equal to $5.4 \times 10^{18}$ cm$^{-3}$ and less than or equal to $8.0 \times 10^{18}$ cm$^{-3}$. However, the crystal defect suppressing layer 6 is not limited to this. When the drift layer 2 has the structure shown in FIG. 3, the effect of reducing crystal defects can be obtained. Thus, the greater effect of reducing crystal defects is expected from the configuration of this embodiment.

<Effects>

This configuration can cause the doping concentration distribution of the breakdown voltage holding layer to approach the doping concentration distribution ideal for reducing the ON resistance by the achievable technique, so that the drift resistance can be reduced by approximately 25% at the maximum. Further, the introduction of the crystal defects caused by the difference in lattice constant between the silicon carbide substrate 1 and the drift layer 2 can be suppressed. Thus, an increase in element resistance can be suppressed without decreasing the mobility of the carriers.

Seventh Embodiment (Inclined Epitaxy+Modulated Epitaxy)

<Configuration>

This embodiment is a modification of the second embodiment or the third embodiment. Hereinafter, the same configuration as the configuration described in the embodiments above is denoted by the same references, and the detailed description will be appropriately omitted.

Figure 17:
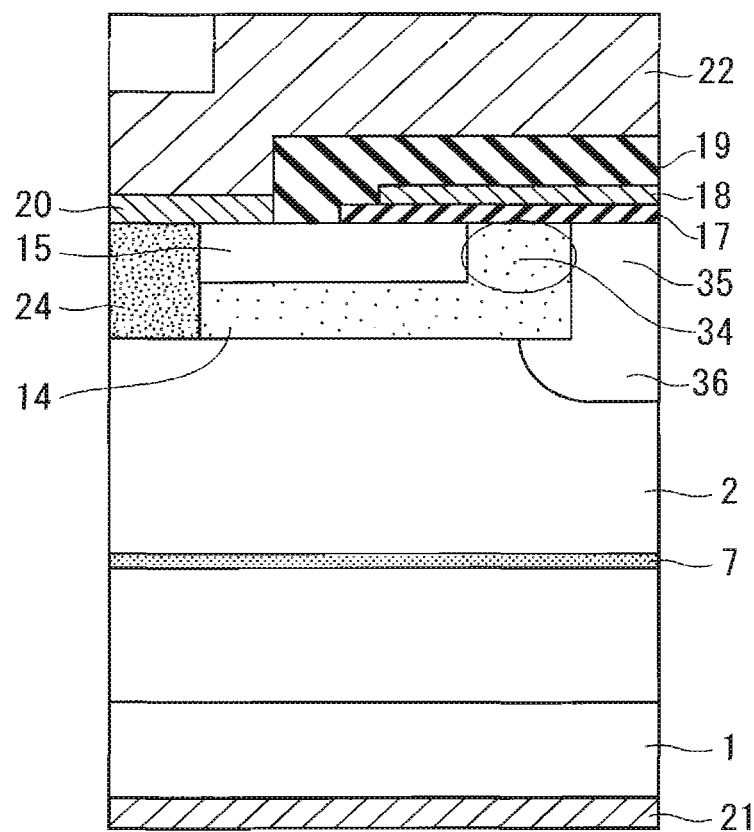
FIG. 17 is a cross-sectional view showing a configuration of a silicon carbide semiconductor element according to an embodiment.

FIG. 17 is a cross-sectional view showing a configuration of a silicon carbide semiconductor element according to this embodiment. This embodiment includes a MOSFET as an example of semiconductor elements, and the same effects can be obtained in another silicon carbide semiconductor device.

The configuration of the silicon carbide MOSFET described in the second embodiment or the third embodiment additionally includes an insertion layer 7 in the drift layer 2. For example, the insertion layer 7 may have a thickness of 20 nm in the drift layer 2 and have a doping concentration of approximately $2 \times 10^{18}$ cm$^{-3}$, which are not restrictive as long as they fall within a range that does not cause degradation of electrical characteristics. When the drift layer 2 has the structure shown in FIG. 3, the effect of reducing crystal defects can be obtained. Thus, the greater effect of reducing crystal defects is expected from the configuration of this embodiment.

<Effects>

This configuration can cause the doping concentration distribution of the breakdown voltage holding layer to approach the doping concentration distribution ideal for reducing the ON resistance by the achievable technique, so that the drift resistance can be reduced by approximately 25% at the maximum. Further, the introduction of the crystal defects caused by the difference in lattice constant between the silicon carbide substrate 1 and the drift layer 2 can be suppressed. Thus, an increase in element resistance can be suppressed without decreasing the mobility of the carriers.

In each of the embodiments described above, the plane direction of the silicon carbide substrate 1 is assumed to be the plane having the off-angle from the (0001) plane. In any crystal plane directions such as the (0001) plane having no off-angle, a (000-1) plane, a (11-20) plane, and a (03-38) plane, the drift layer 2 having the configuration shown in FIG. 1 can suppress the introduction of the crystal defects into the drift layer and can suppress the increase in drift resistance.

In each of the embodiments described above, the polytype of the silicon carbide substrate 1 is assumed to be 4H. In any crystal plane directions of any polytypes such as 6H and 3C, the drift layer having the configuration shown in FIG. 1 can suppress the introduction of the crystal defects into the drift layer and can suppress the increase in drift resistance.

Each of the embodiments described above takes nitrogen as an example of the dopant of the first conductivity type. As long as a dopant other than nitrogen when being doped changes lattice constant, the introduction of the crystal defects into the drift layer and the increase in drift resistance can be suppressed.

Each of the embodiments described above takes aluminum as an example of the dopant of the second conductivity type. As long as a dopant other than aluminum when being doped changes lattice constant oppositely to the change by the dopant of the first conductivity type, the introduction of the crystal defects into the drift layer and the increase in drift resistance can be suppressed.

The configuration of the silicon carbide semiconductor device in each of the embodiment described above is not limited to the Schottky barrier diode, the MOSFET, the pn diode, and the JBS, and the same effects can be obtained in all silicon carbide semiconductor devices having the current path in the thickness direction of the drift layer.

Each of the embodiments described above gives descriptions as to the conductivity types of the impurities, assuming that the n-type is the "first conductivity type" and the p-type is the "second conductivity type," but the p-type may be the "first conductivity type" and the n-type may be the "second conductivity type."

Although the materials of the respective components, the conditions of implementation, and the like are described in the embodiments described above, the foregoing description is in all aspects illustrative and not restrictive. It is therefore understood that numerous modifications (including modifications or omission of given structural components and further including free combinations of different embodiments) can be devised without departing from the scope of the invention.

DESCRIPTION OF NUMERALS 1 silicon carbide substrate; 2, 40 drift layer; 2a to 2i linear concentration distribution layer; 3 p-type region; 4 anode electrode; 5 cathode electrode; 6 crystal defect suppressing layer; 6a, 6b layer; 7 insertion layer; 14 silicon carbide body region; 15 silicon carbide source region; 17 gate insulating film; 18 gate electrode; 19 interlayer insulating film; 20 source electrode; 21 drain electrode; 22 wiring; 24 contact region; 34 region; 35 JFET region; 36 current limiting region; 41 silicon carbide anode region; 42 electric field relaxation region; 100 epitaxial substrate; 101 silicon carbide Schottky barrier diode; 102 silicon carbide MOSFET; 103 silicon carbide pn diode; 104 silicon carbide JBS.

The invention claimed is:

1. A silicon carbide semiconductor device, comprising:
a silicon carbide substrate of a first conductivity type;
a drift layer of the first conductivity type that is formed on said silicon carbide substrate and is doped with a dopant; and
a plurality of body regions of a second conductivity type located at an interval from each other in a surface layer of said drift layer, wherein
said plurality of body regions sandwich a region in the surface layer of said drift layer, and the region is a JFET region,
said JFET region and said body region are cyclically formed,
a surface of said drift layer is a lower surface of said body region,
a doping concentration $N_F$ [cm$^{-3}$] in the surface of said drift layer is expressed by $$N_F = 8.52 \times 10^{19} \, V^{-1.19} \quad \text{[Math 1]}$$

where V [V] represents a rated breakdown voltage,
said drift layer includes a breakdown voltage holding layer that extends from the surface of said drift layer in a film thickness direction and that has a film thickness of d [μm],
said breakdown voltage holding layer has a film thickness d [μm] in a range expressed by $$3.40 \times 10^{-3} \, V^{1.10} < d < 4.16 \times 10^{-3} \, V^{1.10}, \quad \text{[Math 2]}$$

the doping concentration, which is greater than or equal to $3 \times 10^{15}$ cm$^{-3}$ and less than or equal to $1 \times 10^{17}$ cm$^{-3}$, of said dopant in said breakdown voltage holding layer from the surface of said drift layer to a point of the depth d [μm]:
continuously decreases in a film thickness direction of said breakdown voltage holding layer toward the surface of said drift layer from the point of the depth d [μm] from the surface of said drift layer to a modulation point located further toward the surface of said drift layer than a midpoint in the film thickness direction of said breakdown voltage holding layer, and
continuously increases in the film thickness direction of said breakdown voltage holding layer toward the surface of said drift layer from said modulation point to the surface of said drift layer, and
when $0 \leq x < d_{min}$, an ideal doping concentration distribution h ($N_F$, $L_{fp}$, $L_j$, x) [cm$^{-3}$] is expressed by $$\frac{dh}{dx} = -\frac{(L_j + 2x)\lambda}{2L_{fp}} h^3 - \frac{h}{L_j + 2x}, \quad \text{[Math 3]}$$

when $d_{min} \leq x < d$, the ideal doping concentration distribution h ($N_F$, $L_{fp}$, $L_j$, x) [cm$^{-3}$] is expressed by $$\frac{dh}{dx} = -\frac{\lambda}{2} h^3, \quad \text{[Math 4]}$$

and by using the ideal doping concentration distribution h ($N_F$, $L_{fp}$, $L_j$, x) calculated from the expressions, a concentration distribution g(x) [cm$^{-3}$] of said breakdown voltage holding layer is expressed by $$(1-0.2)h(N_F,L_{fp},L_j,x) < g(x) < (1+0.2)h(N_F,L_{fp},L_j,x) \quad \text{[Math 5]}$$

where an x axis direction represents said film thickness direction, x=0 [μm] represents the surface of said drift layer, x=d [μm] represents the point of the depth d [μm] from the surface of said drift layer, $d_{min}$ [μm] represents a distance from the surface of said drift layer to said modulation point in the film thickness direction, $L_{fp}$ [μm] represents an arrangement pitch of said body regions, $L_j$ [μm] represents a width of said JFET region located between said body regions adjacent to each other, and λ [m$^5$C$^2$/V$^2$F$^2$] represents a negative value that defines a concentration distribution.

2. A silicon carbide semiconductor device, comprising:
a silicon carbide substrate of a first conductivity type;
a drift layer of the first conductivity type that is formed on said silicon carbide substrate and is doped with a dopant; and
a plurality of body regions of a second conductivity type located at an interval from each other in a surface layer of said drift layer, wherein
said plurality of body regions sandwich a region in the surface layer of said drift layer, and the region is a JFET region,
said JFET region is discretely formed in a y direction and a z direction, which are two plane directions perpendicular to the x axis being a film thickness direction,
a surface of said drift layer is a tower surface of said body region,
a doping concentration $N_F$ [cm$^{-3}$] in the surface of said drift layer is expressed by $$N_F = 8.52 \times 10^{19} \, V^{-1.19} \quad \text{[Math 6]}$$

where V [V] represents a rated breakdown voltage,
said drift layer includes a breakdown voltage holding layer that extends from the surface of said drift layer in a film thickness direction and that has a film thickness of d [μm],
said breakdown voltage holding layer has a film thickness d [μm] in a range expressed by $$3.40 \times 10^{-3} \, V^{1.10} < d < 4.16 \times 10^{-3} \, V^{1.10}, \quad \text{[Math 7]}$$

the doping concentration, which is greater than or equal to $3 \times 10^{15}$ cm$^{-3}$ and less than or equal to $1 \times 10^{17}$ cm$^{-3}$, of said dopant in said breakdown voltage holding layer from the surface of said drift layer to a point of the depth d [μm]:
continuously decreases in a film thickness direction of said breakdown voltage holding layer toward the surface of said drift layer from the point of the depth d [μm] from the surface of said drift layer to a modulation point located further toward the surface of said drift layer than a midpoint in the film thickness direction of said breakdown voltage holding layer, and
continuously increases in the film thickness direction of said breakdown voltage holding layer toward the surface of said drift layer from said modulation point to the surface of said drift layer, and
when $0 \leq x < d_{min}$, an ideal doping concentration distribution k ($N_F$, $L_{fp2}$, $L_{j2}$, x) [cm$^{-3}$] is expressed by $$\frac{dk}{dx} = -\frac{\lambda}{2L_{fp2}^2}(L_{j2} + 2x)(L_{j2} + 2x - 2L_{fp2})k^3 + \frac{2(L_{fp2} - L_{j2} - 2x)}{(L_{j2} + 2x)(L_{j2} + 2x - 2L_{fp2})}k, \quad \text{[Math 8]}$$

when $d_{min} \leq x < d$, the ideal doping concentration distribution k ($N_F$, $L_{fp2}$, $L_{j2}$, x) [cm$^{-3}$] is expressed by $$\frac{dk}{dx} = -\frac{\lambda}{2} k^3, \quad \text{[Math 9]}$$

and by using the ideal doping concentration distribution k ($N_F$, $L_{fp2}$, $L_{j2}$, x) [cm$^{-3}$] calculated from the expressions, a concentration distribution g(x) [cm$^{-3}$] of said breakdown voltage holding layer is expressed by $$(1-0.2)k(N_F,L_{fp2},L_{j2},x) < g(x) < (1+0.2)k(N_F,L_{fp2},L_{j2},x) \quad \text{[Math 10]}$$

where an x axis direction represents said film thickness direction, x=0 [μm] represents the surface of said drift layer, x=d [μm] represents the point of the depth d [μm] from the surface of said drift layer, $d_{min}$ [μm] represents a distance from the surface of said drift layer to said modulation point in the film thickness direction, $L_{fp2}$ [μm] represents an arrangement pitch of said body regions, $L_{j2}$ [μm] represents a width of said JFET region located between said body regions adjacent to each other, and λ [m$^5$C$^2$/V$^2$F$^2$] represents a negative value that defines a concentration distribution.

3. The silicon carbide semiconductor device according to claim 1, wherein λ that is the negative value defining said concentration distribution is greater than or equal to $-1 \times 10^{-37}$ m$^5$C$^2$/V$^2$F$^2$ and less than or equal to $-1 \times 10^{-39}$ m$^5$C$^2$/V$^2$F$^2$.

4. The silicon carbide semiconductor device according to claim 2, wherein λ that is the negative value defining said concentration distribution is greater than or equal to $-1 \times 10^{-37}$ m$^5$C$^2$/V$^2$F$^2$ and less than or equal to $-1 \times 10^{-39}$ m$^5$C$^2$/V$^2$F$^2$.

5. The silicon carbide semiconductor device according to claim 1, wherein a distance from said modulation point to the surface of said drift layer is less than or equal to ⅓ of the film thickness of said breakdown voltage holding layer.

6. The silicon carbide semiconductor device according to claim 2, wherein a distance from said modulation point to the surface of said drift layer is less than or equal to ⅓ of the film thickness of said breakdown voltage holding layer.

7. A silicon carbide semiconductor device, comprising:
a silicon carbide substrate of a first conductivity type; and
a drift layer of the first conductivity type that is formed on said silicon carbide substrate and is doped with a dopant, wherein
said drift layer includes a breakdown voltage holding layer that extends from the surface of said drift layer in a film thickness direction and that has a film thickness of d [μm],
the doping concentration of said dopant in said breakdown voltage holding layer continuously decreases in a film thickness direction of said breakdown voltage holding layer toward the surface of said drift layer, a doping concentration $N_F$ [cm$^{-3}$] in the surface of said drift layer is expressed by $$N_F = 4.58 \times 10^{19} \, V^{-1.23} \quad \text{[Math 11]}$$

where V [V] represents a rated breakdown voltage, said breakdown voltage holding layer has a film thickness d [μm] in a range expressed by $$2.90 \times 10^{-3} \, V^{1.12} < d < 3.55 \times 10^{-3} \, V^{1.12}, \quad \text{[Math 12]}$$

the doping concentration of said dopant in said breakdown voltage holding layer from the surface of said drift layer to a point of the depth d [μm] is greater than or equal to $4 \times 10^{15}$ cm$^{-3}$ and less than or equal to $2 \times 10^{17}$ cm$^{-3}$, and an ideal doping concentration distribution f(x) [cm$^{-3}$] expressed by $$f(x) = N_F \left\{ 1 - \left[ 1 - \left( \frac{N_F}{N_I} \right)^2 \right] \frac{x}{d} \right\}^{-1/2} \quad \text{[Math 13]}$$

$$(0 \leq x \leq d),$$

and a relationship between a doping concentration $f_L(x_i)$ [cm$^{-3}$] of said breakdown voltage holding layer in said film thickness direction and the ideal doping concentration distribution f(x) [cm$^{-3}$] is expressed by $$(1 - 0.2)f(x) \leq f_L(x_i) < (1 + 0.2)f(x) \quad \text{[Math 14]}$$

where an x axis direction represents said film thickness direction, x=0 [μm] represents the surface of said drift layer, x=d [μm] represents the point of the depth d [μm] from the surface of said drift layer, and a doping concentration $N_I$ [cm$^{-3}$] represents said doping concentration at the point of the depth d [μm] from the surface of said drift layer.

8. The silicon carbide semiconductor device according to claim 7, wherein said silicon carbide semiconductor device is a diode.

9. The silicon carbide semiconductor device according to claim 1, wherein said body regions of the second conductivity type are located in an upper surface of said drift layer, the surface of said drift layer is the lower surface of said body region, and the region sandwiched between said body regions adjacent to each other is the JFET region.

10. The silicon carbide semiconductor device according to claim 1, wherein said breakdown voltage holding layer has a plurality of linear concentration distribution layers laminated in said film thickness direction.

11. The silicon carbide semiconductor device according to claim 2, wherein said breakdown voltage holding layer has a plurality of linear concentration distribution layers laminated in said film thickness direction.

12. The silicon carbide semiconductor device according to claim 7, wherein said breakdown voltage holding layer has a plurality of linear concentration distribution layers laminated in said film thickness direction.

13. The silicon carbide semiconductor device according to claim 1, wherein said dopant is nitrogen.

14. The silicon carbide semiconductor device according to claim 2, wherein said dopant is nitrogen.

15. The silicon carbide semiconductor device according to claim 7, wherein said dopant is nitrogen.

* * * * *